United States Patent
Morishita et al.

(10) Patent No.: US 11,408,091 B2
(45) Date of Patent: Aug. 9, 2022

(54) GALLIUM ARSENIDE CRYSTAL SUBSTRATE

(71) Applicant: SUMITOMO ELECTRIC INDUSTRIES, LTD., Osaka (JP)

(72) Inventors: Masanori Morishita, Kobe (JP); Hidetoshi Takayama, Kobe (JP); Yasuaki Higuchi, Kobe (JP); Yoshiaki Hagi, Kobe (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 392 days.

(21) Appl. No.: 16/630,183

(22) PCT Filed: Feb. 23, 2018

(86) PCT No.: PCT/JP2018/006654
§ 371 (c)(1),
(2) Date: Jan. 10, 2020

(87) PCT Pub. No.: WO2019/163081
PCT Pub. Date: Aug. 29, 2019

(65) Prior Publication Data
US 2020/0131668 A1    Apr. 30, 2020

(51) Int. Cl.
*C30B 29/42* (2006.01)
(52) U.S. Cl.
CPC .................................... *C30B 29/42* (2013.01)
(58) Field of Classification Search
CPC .............................. C30B 29/42; C30B 11/00
See application file for complete search history.

(56) References Cited

U.S. PATENT DOCUMENTS

| 6,180,269 | B1 | 1/2001 | Hagi et al. |
| 6,254,677 | B1 | 7/2001 | Hashio et al. |

(Continued)

FOREIGN PATENT DOCUMENTS

| CN | 1796968 A | 7/2006 |
| CN | 101451265 A | 6/2009 |

(Continued)

OTHER PUBLICATIONS

W. A. Gault et al., "The Growth of High Quality III-V Crystal by the Vertical Gradient Freeze Method", Defect Control in Semiconductors, 1990, pp. 653-660.

(Continued)

*Primary Examiner* — Jaehwan Oh
(74) *Attorney, Agent, or Firm* — Oliff PLC

(57) ABSTRACT

A gallium arsenide crystal substrate has a diameter not smaller than 150 mm and not greater than 205 mm and a thickness not smaller than 300 μm and not greater than 800 μm and includes any of a flat portion and a notch portion. In any of a first flat region and a first notch region, when an atomic concentration of silicon is not lower than $3.0 \times 10^{16}$ $cm^{-3}$ and not higher than $3.0 \times 10^{19}$ $cm^{-3}$, the gallium arsenide crystal substrate has an average dislocation density not lower than 0 $cm^{-2}$ and not higher than 15000 $cm^{-2}$, and when an atomic concentration of carbon is not lower than $1.0 \times 10^{15}$ $cm^{-3}$ and not higher than $5.0 \times 10^{17}$ $cm^{-3}$, the gallium arsenide crystal substrate has an average dislocation density not lower than 3000 $cm^{-2}$ and not higher than 20000 $cm^{-2}$.

11 Claims, 7 Drawing Sheets

(56) References Cited

U.S. PATENT DOCUMENTS

2011/0274879 A1    11/2011  Sakurada et al.
2020/0066850 A1*    2/2020  Nishioka ................. C30B 25/20

FOREIGN PATENT DOCUMENTS

| CN | 102292477 A | 12/2011 |
| CN | 103789835 A | 5/2014 |
| CN | 104109906 A | 10/2014 |
| EP | 2390387 A1 | 11/2011 |
| JP | H05-339100 A | 12/1993 |
| JP | 2000-103699 A | 4/2000 |
| JP | 2006-188403 A | 7/2006 |
| JP | 2008-239480 A | 10/2008 |
| JP | 2012-31004 A | 2/2012 |
| WO | 2010/084878 | 7/2010 |

OTHER PUBLICATIONS

M. Yamada, "High-sensitivity computer-controlled infrared polariscope", Review of Scientific Instruments, vol. 64, No. 7, Jul. 1993, pp. 1815-1821.
Sawada et al.; "Development of a 6-inch diameter VB-GaAs wafer"; XP002804200; Database accession No. 6569143, abstract.
Kawase et al.; "Low-dislocation-density and Low-residual-strain Semi-insulating GaAs Grown by Vertical Boat Method"; Semiconducting and Insulating Materials; Proceedings of the 9th Conference; 1996; pp. 275-278.

* cited by examiner (A)

(B)

(C)

GALLIUM ARSENIDE CRYSTAL SUBSTRATE

TECHNICAL FIELD

The present invention relates to a gallium arsenide crystal substrate.

BACKGROUND ART

Japanese Patent Laying-Open No. 2008-239480 (PTL 1) discloses as gallium arsenide crystals high in crystal quality, semiconductor crystals composed of gallium arsenide, the semiconductor crystal having a diameter not smaller than six inches and an average dislocation density not higher than $1 \times 10^4$ cm$^{-2}$, and further discloses semiconductor crystals preferably having average residual strain not more than $1 \times 10^{-5}$ measured by a photoelastic method. W. A. Gault et al., "The Growth of High Quality III-V Crystal by the Vertical Gradient Freeze Method," Defect Control in Semiconductors, 1990, pp. 653-660 (NPL 1) discloses a method of growing high-quality gallium arsenide by the vertical gradient freeze (VGF) method. M. Yamada, "High-sensitivity computer-controlled infrared polariscope," Review of Scientific Instruments, Vol. 64, No. 7, July 1993, pp. 1815-1821 (NPL 2) discloses a method of measuring, by using a high-sensitivity computer-controlled infrared polariscope, small phase retardation and birefringence of a principal axis caused by residual strain in a commercially available semi-insulating gallium arsenide (111) wafer grown by the LEC method.

CITATION LIST

Patent Literature

PTL 1: Japanese Patent Laying-Open No. 2008-239480

Non Patent Literature

NPL 1: W. A. Gault et al., "The Growth of High Quality III-V Crystal by the Vertical Gradient Freeze Method", Defect Control in Semiconductors, 1990, pp. 653-660

NPL 2: M. Yamada, "High-sensitivity computer-controlled infrared polariscope", Review of Scientific Instruments, Vol. 64, No. 7, July 1993, pp. 1815-1821

SUMMARY OF INVENTION

A gallium arsenide crystal substrate according to one manner of the present invention includes a main surface having a diameter not smaller than 150 mm and not greater than 205 mm and a thickness not smaller than 300 μm and not greater than 800 μm. A part of an outer edge of the gallium arsenide crystal substrate includes any of a flat portion and a notch portion. The gallium arsenide crystal substrate contains any of silicon atoms at a concentration not lower than $3.0 \times 10^{16}$ cm$^{-3}$ and not higher than $3.0 \times 10^{19}$ cm$^{-3}$ and carbon atoms at a concentration not lower than $1.0 \times 10^{15}$ cm$^{-3}$ and not higher than $5.0 \times 10^{17}$ cm$^{-3}$. In any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface, when the gallium arsenide crystal substrate contains the silicon atoms, the gallium arsenide crystal substrate has an average dislocation density not lower than 0 cm$^{-2}$ and not higher than 15000 cm$^{-2}$, and when the gallium arsenide crystal substrate contains the carbon atoms, the gallium arsenide crystal substrate has an average dislocation density not lower than 3000 cm$^{-2}$ and not higher than 20000 cm$^{-2}$.

A gallium arsenide crystal substrate according to one manner of the present invention includes a main surface having a diameter not smaller than 150 mm and not greater than 205 mm and a thickness not smaller than 300 μm and not greater than 800 μm. A part of an outer edge of the gallium arsenide crystal substrate includes any of a flat portion and a notch portion. The gallium arsenide crystal substrate contains any of silicon atoms at a concentration not lower than $3.0 \times 10^{16}$ cm$^{-3}$ and not higher than $3.0 \times 10^{19}$ cm$^{-3}$ and carbon atoms at a concentration not lower than $1.0 \times 10^{15}$ cm$^{-3}$ and not higher than $5.0 \times 10^{17}$ cm$^{-3}$. The gallium arsenide crystal substrate has average residual strain not less than $2 \times 10^{-6}$ and not more than $1 \times 10^{-4}$ in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface.

A gallium arsenide crystal substrate according to one manner of the present invention includes a main surface having a diameter not smaller than 150 mm and not greater than 205 mm and a thickness not smaller than 300 μm and not greater than 800 μm. A part of an outer edge of the gallium arsenide crystal substrate includes any of a flat portion and a notch portion. The gallium arsenide crystal substrate contains any of silicon atoms at a concentration not lower than $3.0 \times 10^{16}$ cm$^{-3}$ and not higher than $3.0 \times 10^{19}$ cm$^{-3}$ and carbon atoms at a concentration not lower than $1.0 \times 10^{15}$ cm$^{-3}$ and not higher than $5.0 \times 10^{17}$ cm$^{-3}$. In any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface, when the gallium arsenide crystal substrate contains the silicon atoms, the gallium arsenide crystal substrate has an average dislocation density not lower than 0 cm$^{-2}$ and not higher than 15000 cm$^{-2}$, and when the gallium arsenide crystal substrate contains the carbon atoms, the gallium arsenide crystal substrate has an average dislocation density not lower than 3000 cm$^{-2}$ and not higher than 20000 cm$^{-2}$.

A gallium arsenide crystal substrate according to one manner of the present invention includes a main surface having a diameter not smaller than 150 mm and not greater than 205 mm and a thickness not smaller than 300 μm and not greater than 800 μm. A part of an outer edge of the gallium arsenide crystal substrate includes any of a flat portion and a notch portion. The gallium arsenide crystal substrate contains any of silicon atoms at a concentration not lower than $3.0 \times 10^{16}$ cm$^{-3}$ and not higher than $3.0 \times 10^{19}$ cm$^{-3}$ and carbon atoms at a concentration not lower than $1.0 \times 10^{15}$ cm$^{-3}$ and not higher than $5.0 \times 10^{17}$ cm$^{-3}$. The gallium arsenide crystal substrate has average residual strain not less than $2 \times 10^{-6}$ and not more than $1 \times 10^{-4}$ in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface.

DETAILED DESCRIPTION

Figure 1A:
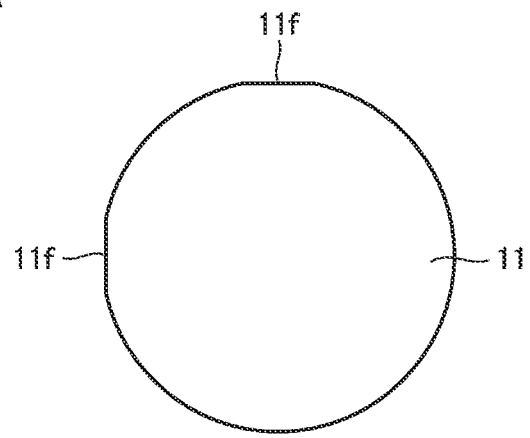
FIG. 1A is a schematic plan view showing an exemplary location of a part of an outer edge where a flat portion is formed, in a gallium arsenide crystal substrate according to one manner of the present invention.

Problem to be Solved by the Present Disclosure

Semiconductor crystals composed of gallium arsenide disclosed in Japanese Patent Laying-Open No. 2008-239480 (PTL 1), gallium arsenide disclosed in W. A. Gault et al., "The Growth of High Quality III-V Crystal by the Vertical Gradient Freeze Method," Defect Control in Semiconductors, 1990, pp. 653-660 (NPL 1), and a semi-insulating gallium arsenide (111) wafer disclosed in M. Yamada, "High-sensitivity computer-controlled infrared polariscope," Review of Scientific Instruments, Vol. 64, No. 7, July 1993, pp. 1815-1821 (NPL 2) are disadvantageously high in ratio of defects due to cracking (a crack defect ratio) in a flat portion and the vicinity thereof or a notch portion and the vicinity thereof in manufacturing of a substrate including any of the flat portion and the notch portion in a part of an outer edge (in manufacturing of a substrate with flat portion/notch portion) and in growth of an epitaxial layer on the substrate including any of the flat portion and the notch portion in a part of the outer edge (in growth of an epitaxial layer on a substrate with flat portion/notch portion).

Though Japanese Patent Laying-Open No. 2008-239480 (PTL 1), "The Growth of High Quality III-V Crystal by the Vertical Gradient Freeze Method," Defect Control in Semiconductors, 1990, pp. 653-660 (NPL 1), and M. Yamada, "High-sensitivity computer-controlled infrared polariscope," Review of Scientific Instruments, Vol. 64, No. 7, July 1993, pp. 1815-1821 (NPL 2) have defined an average dislocation density or average residual strain over all crystals of gallium arsenide or the entire wafer, they have not discussed an average dislocation density or average residual strain in the flat portion and the vicinity thereof or the notch portion and the vicinity thereof.

Therefore, an object is to provide a gallium arsenide crystal substrate low in ratio of defects due to cracking (crack defect ratio) in a flat portion and the vicinity thereof or a notch portion and the vicinity thereof in manufacturing of a substrate with flat portion/notch portion and in growth of an epitaxial layer on the substrate with flat portion/notch portion.

Advantageous Effect of the Present Disclosure

According to the present disclosure, a gallium arsenide crystal substrate low in ratio of defects due to cracking (crack defect ratio) in a flat portion and the vicinity thereof or a notch portion and the vicinity thereof in manufacturing of a substrate with flat portion/notch portion and in growth of an epitaxial layer on the substrate with flat portion/notch portion can be provided.

Description of Embodiments of the Present Invention

Embodiments of the present invention will initially be listed and described. In order to clearly distinguish among a plurality of flat regions and notch regions, denotations as a first flat region and a first notch region or a second flat region and a second notch region are given.

[1] A gallium arsenide (GaAs) crystal substrate according to one manner of the present invention includes a main surface having a diameter not smaller than 150 mm and not greater than 205 mm and a thickness not smaller than 300 µm and not greater than 800 µm. A part of an outer edge of the GaAs crystal substrate includes any of a flat portion and a notch portion. The GaAs crystal substrate contains any of silicon (Si) atoms at a concentration not lower than $3.0\times10^{16}$ $cm^{-3}$ and not higher than $3.0\times10^{19}$ $cm^{-3}$ and carbon (C) atoms at a concentration not lower than $1.0\times10^{15}$ $cm^{-3}$ and not higher than $5.0\times10^{17}$ $cm^{-3}$. In any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface, when the GaAs crystal substrate contains Si atoms, the GaAs crystal substrate has an average dislocation density not lower than 0 $cm^{-2}$ and not higher than 15000 $cm^{-2}$, and when the GaAs crystal substrate contains C atoms, the GaAs crystal substrate has an average dislocation density not lower than 3000 $cm^{-2}$ and not higher than 20000 $cm^{-2}$. Since the GaAs crystal substrate in the present manner has an average dislocation density within a prescribed range in any of the first flat region and the first notch region, it is low in crack defect ratio in manufacturing of the substrate and in growth of an epitaxial layer on the substrate.

[2] A GaAs crystal substrate according to one manner of the present invention includes a main surface having a diameter not smaller than 150 mm and not greater than 205 mm and a thickness not smaller than 300 μm and not greater than 800 μm. A part of an outer edge of the GaAs crystal substrate includes any of a flat portion and a notch portion. The GaAs crystal substrate contains any of Si atoms at a concentration not lower than $3.0\times10^{16}$ $cm^{-3}$ and not higher than $3.0\times10^{19}$ $cm^{-3}$ and C atoms at a concentration not lower than $1.0\times10^{15}$ $cm^{-3}$ and not higher than $5.0\times10^{17}$ $cm^{-3}$. The GaAs crystal substrate has average residual strain not less than $2\times10^{-6}$ and not more than $1\times10^{-4}$ in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface. Since the GaAs crystal substrate in the present manner has average residual strain within a prescribed range in any of the first flat region and the first notch region, it is low in crack defect ratio in manufacturing of the substrate and in growth of an epitaxial layer on the substrate.

[3] A GaAs crystal substrate according to one manner of the present invention includes a main surface having a diameter not smaller than 150 mm and not greater than 205 mm and a thickness not smaller than 300 μm and not greater than 800 μm. A part of an outer edge of the GaAs crystal substrate includes any of a flat portion and a notch portion. The GaAs crystal substrate contains any of Si atoms at a concentration not lower than $3.0\times10^{16}$ $cm^{-3}$ and not higher than $3.0\times10^{19}$ $cm^{-3}$ and C atoms at a concentration not lower than $1.0\times10^{15}$ $cm^{-3}$ and not higher than $5.0\times10^{17}$ $cm^{-3}$. In any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface, when the GaAs crystal substrate contains Si atoms, the GaAs crystal substrate can have an average dislocation density not lower than 0 $cm^{-2}$ and not higher than 15000 $cm^{-2}$ and average residual strain not less than $2\times10^{-6}$ and not more than $1\times10^{-4}$, and when the GaAs crystal substrate contains C atoms, the GaAs crystal substrate can have an average dislocation density not lower than 3000 $cm^{-2}$ and not higher than 20000 $cm^{-2}$ and average residual strain not less than $2\times10^{-6}$ and not more than $1\times10^{-4}$. Since the GaAs crystal substrate in the present manner has an average dislocation density and average residual strain each within a prescribed range in any of the first flat region and the first notch region, it is lower in crack defect ratio in manufacturing of the substrate and in growth of an epitaxial layer on the substrate.

[4] A GaAs crystal substrate according to one manner of the present invention includes a main surface having a diameter not smaller than 150 mm and not greater than 205 mm and a thickness not smaller than 300 μm and not greater than 800 μm. A part of an outer edge of the GaAs crystal substrate includes any of a flat portion and a notch portion. The GaAs crystal substrate contains any of silicon (Si) atoms at a concentration not lower than $3.0\times10^{16}$ $cm^{-3}$ and not higher than $3.0\times10^{19}$ $cm^{-3}$ and carbon (C) atoms at a concentration not lower than $1.0\times10^{15}$ $cm^{-3}$ and not higher than $5.0\times10^{17}$ $cm^{-3}$. In any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface, when the GaAs crystal substrate contains Si atoms, the GaAs crystal substrate has an average dislocation density not lower than 0 $cm^{-2}$ and not higher than 15000 $cm^{-2}$, and when the GaAs crystal substrate contains C atoms, the GaAs crystal substrate has an average dislocation density not lower than 3000 $cm^{-2}$ and not higher than 20000 $cm^{-2}$. Since the GaAs crystal substrate in the present manner has an average dislocation density within a prescribed range in any of the second flat region and the second notch region and can control the average dislocation density in a partial region located in the vicinity of an outer circumferential portion of any of the first flat region and the first notch region to be within a certain range, the GaAs crystal substrate is low in crack defect ratio in manufacturing of the substrate and in growth of an epitaxial layer on the substrate.

[5] A GaAs crystal substrate according to one manner of the present invention includes a main surface having a diameter not smaller than 150 mm and not greater than 205 mm and a thickness not smaller than 300 μm and not greater than 800 μm. A part of an outer edge of the GaAs crystal substrate includes any of a flat portion and a notch portion. The GaAs crystal substrate contains any of Si atoms at a concentration not lower than $3.0\times10^{16}$ $cm^{-3}$ and not higher than $3.0\times10^{19}$ $cm^{-3}$ and C atoms at a concentration not lower than $1.0\times10^{15}$ $cm^{-3}$ and not higher than $5.0\times10^{17}$ $cm^{-3}$. The GaAs crystal substrate has average residual strain not less than $2\times10^{-6}$ and not more than $1\times10^{-4}$ in any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface. Since the GaAs crystal substrate in the present manner has average residual strain within a prescribed range in any of the second flat region and the second notch region and can control the average residual strain in a partial region located in the vicinity of an outer circumferential portion of any of the first flat region and the first notch region to be within a certain range, the GaAs crystal substrate is low in crack defect ratio in manufacturing of the substrate and in growth of an epitaxial layer on the substrate.

[6] A GaAs crystal substrate according to one manner of the present invention includes a main surface having a diameter not smaller than 150 mm and not greater than 205 mm and a thickness not smaller than 300 μm and not greater than 800 μm. A part of an outer edge of the GaAs crystal substrate includes any of a flat portion and a notch portion. The GaAs crystal substrate contains any of Si atoms at a concentration not lower than $3.0 \times 10^{16}$ cm$^{-3}$ and not higher than $3.0 \times 10^{19}$ cm$^{-3}$ and C atoms at a concentration not lower than $1.0 \times 10^{15}$ cm$^{-3}$ and not higher than $5.0 \times 10^{17}$ cm$^{-3}$. In any of a second flat region extending over a width from the flat portion to a position at a distance of 1 mm in a direction perpendicular to a straight line indicating the flat portion in the main surface and a second notch region extending over a width from the notch portion to a position at a distance of 1 mm in a direction perpendicular to a curve indicating the notch portion in the main surface, when the GaAs crystal substrate contains Si atoms, the GaAs crystal substrate can have an average dislocation density not lower than 0 cm$^{-2}$ and not higher than 15000 cm$^{-2}$ and average residual strain not less than $2 \times 10^{-6}$ and not more than $1 \times 10^{-4}$, and when the GaAs crystal substrate contains C atoms, the GaAs crystal substrate can have an average dislocation density not lower than 3000 cm$^{-2}$ and not higher than 20000 cm$^{-2}$ and average residual strain not less than $2 \times 10^{-6}$ and not more than $1 \times 10^{-4}$. Since the GaAs crystal substrate in the present manner has an average dislocation density and average residual strain each within a prescribed range in any of the second flat region and the second notch region, it is lower in crack defect ratio in manufacturing of the substrate and in growth of an epitaxial layer on the substrate.

Details of Embodiments of the Present Invention

<GaAs Crystal Substrate>

Figure 1B:
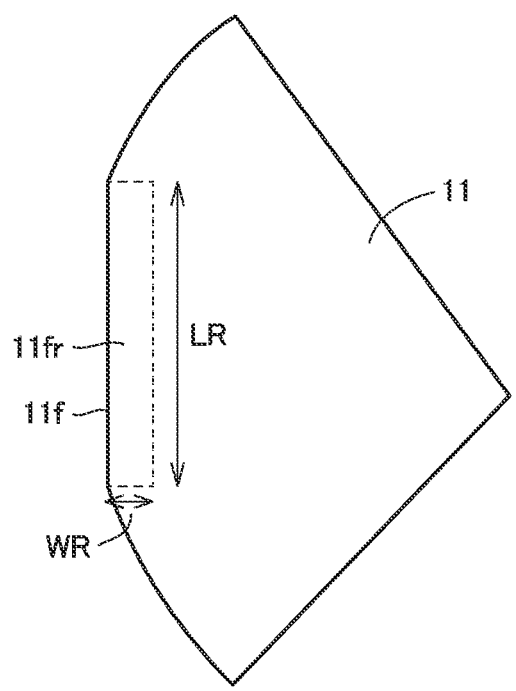
FIG. 1B is an enlarged schematic plan view showing an exemplary flat portion and first and second flat regions in the gallium arsenide crystal substrate according to one manner of the present invention.

FIGS. 1A, 1B, 2A, and 2B show an exemplary GaAs crystal substrate 11 in the present embodiment. FIG. 1A is a schematic plan view showing a location of a part of an outer edge of GaAs crystal substrate 11 where a flat portion 11*f* is formed. FIG. 1B is an enlarged schematic plan view showing flat portion 11*f* and first and second flat regions 11*fr*. Flat portion 11*f* refers to a flat surface formed in a part of an outer edge (outer circumference) of a crystalline body and a crystal substrate for facilitating determination of a crystal orientation of the crystalline body and the crystal substrate, distinction between the front and the rear, and registration in a process. In GaAs crystal substrate 11 with flat portion, at least one flat portion 11*f* is formed and normally two flat portions are formed, which are also called orientation flat (which is also referred to as OF below) and identification flat (which is also referred to as IF below). In GaAs crystal substrate 11, a plane orientation of a main surface, an off direction, an off angle, and a position of the flat portion (OF/IF) are set as desired by a client. For example, the plane orientation of the main surface is set as (100), eight off directions are set, an off angle is set to be not smaller than 0° and not greater than 20°, OF/IF positions are set as two types of a clockwise position (which is also referred to as CW below, IF being arranged at a clockwise position with respect to OF) and a counterclockwise position (which is also referred to as CCW, IF being arranged at a counterclockwise position with respect to OF), an OF length is set to be not shorter than 40 mm and not longer than 65 mm, and an IF length is set to be not shorter than 20 mm and not longer than 45 mm.

Figure 2A:
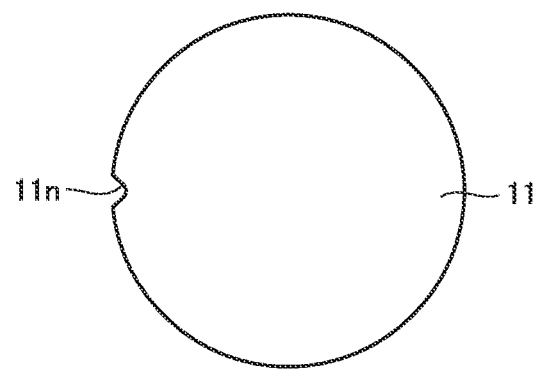
FIG. 2A is a schematic plan view showing an exemplary location of a part of an outer edge where a notch portion is provided, in the gallium arsenide crystal substrate according to one manner of the present invention.
Figure 2B:
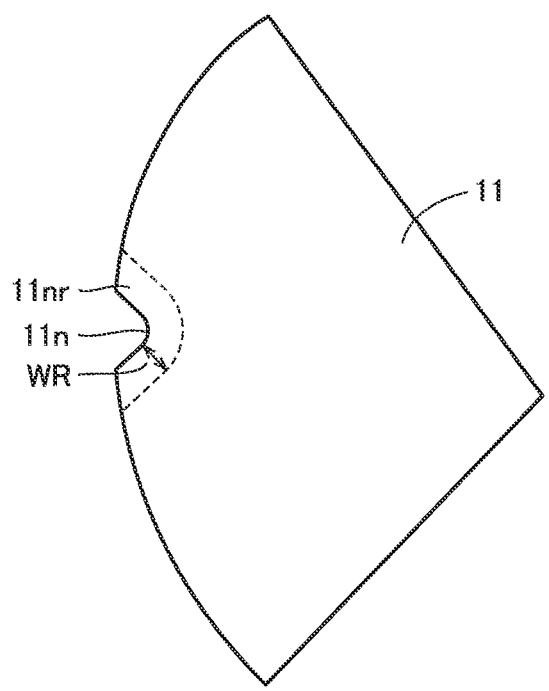
FIG. 2B is an enlarged schematic plan view showing the notch portion and first and second notch regions in the gallium arsenide crystal substrate according to one manner of the present invention.

FIG. 2A is a schematic plan view showing a location of a part of the outer edge of GaAs crystal substrate 11 where a notch portion 11*n* is provided. FIG. 2B is an enlarged schematic plan view showing notch portion 11*n* and first and second notch regions 11*nr*. Notch portion 11*n* refers to a cut portion provided in a part of the outer edge (outer circumference) of a crystalline body and a crystal substrate for facilitating determination and alignment of a crystal orientation of the crystalline body and the crystal substrate. In GaAs crystal substrate 11 with notch portion, at least one notch portion 11*n* is provided and normally one notch portion is provided. In GaAs crystal substrate 11, a plane orientation of a main surface, a shape of the notch, and a direction of a central cut of the notch are set as desired by a client. For example, the plane orientation of the main surface is set as (100), a notch is shaped by cutting off a portion having a size not smaller than 0.5 mm and not greater than 1.5 mm from the outer edge toward the center at an opening angle not smaller than 85° and not greater than 95°, and a direction of the central cut of the notch is set to a [010] direction when viewed from the center.

Embodiment I-1

Referring to FIGS. 1A, 1B, 2A, and 2B, GaAs crystal substrate 11 in the present embodiment includes a main surface having a diameter not smaller than 150 mm and not greater than 205 mm and a thickness not smaller than 300 μm and not greater than 800 μm. A part of an outer edge of GaAs crystal substrate 11 includes any of flat portion 11*f* and notch portion 11*n*. GaAs crystal substrate 11 contains any of Si atoms at a concentration not lower than $3.0 \times 10^{16}$ cm$^{-3}$ and not higher than $3.0 \times 10^{19}$ cm$^{-3}$ and C atoms at a concentration not lower than $1.0 \times 10^{15}$ cm$^{-3}$ and not higher than $5.0 \times 10^{17}$ cm$^{-3}$. In any of first flat region 11*fr* extending over a width WR from flat portion 11*f* to a position at a distance of 2 mm in a direction perpendicular to a straight line indicating flat portion 11*f* in the main surface and first notch region 11*nr* extending over width WR from notch portion 11*n* to a position at a distance of 2 mm in a direction perpendicular to a curve indicating notch portion 11*n* in the main surface, when GaAs crystal substrate 11 contains Si atoms, GaAs crystal substrate 11 has an average dislocation density not lower than 0 cm$^{-2}$ and not higher than 15000 cm$^{-2}$, and when GaAs crystal substrate 11 contains C atoms, GaAs crystal substrate 11 has an average dislocation density not lower than 3000 cm$^{-2}$ and not higher than 20000 cm$^{-2}$. Since GaAs crystal substrate 11 in the present embodiment has an average dislocation density within a prescribed range in any of first flat region 11*fr* and first notch region 11*nr*, it is low in crack defect ratio in manufacturing of the substrate and in growth of an epitaxial layer on the substrate.

"Being perpendicular to a curve indicating the notch portion in the main surface" in the GaAs crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaAs crystal substrate, a type (Si atoms or C atoms) or a concentration of contained atoms, or a difference in manufacturing of a substrate or growth of an epitaxial layer, and being low in crack defect ratio means a relatively low crack defect ratio so long as a diameter of the GaAs crystal substrate, a type (Si atoms or C atoms) or a concentration of contained atoms, and manufacturing of the substrate or growth of an epitaxial layer are identical.

GaAs crystal substrate 11 in the present embodiment includes a main surface having a diameter not smaller than 150 mm and not greater than 205 mm and a thickness not smaller than 300 µm and not greater than 800 µm. From a point of view of lowering in crack defect ratio also in GaAs crystal substrate 11 large in diameter, GaAs crystal substrate 11 has a diameter not smaller than 150 mm and not greater than 205 mm. From a point of view of lowering in crack defect ratio, GaAs crystal substrate 11 has a thickness not smaller than 300 µm and not greater than 800 µm.

A part of the outer edge of GaAs crystal substrate 11 in the present embodiment includes any of flat portion 11$f$ (FIGS. 1A and 1B) and notch portion 11$n$ (FIGS. 2A and 2B). By suppressing crack in flat portion 11$f$ and the vicinity thereof or also in notch portion 11$n$ and the vicinity thereof in GaAs crystal substrate 11, the crack defect ratio can be lowered.

GaAs crystal substrate 11 in the present embodiment contains any of Si atoms at a concentration not lower than $3.0 \times 10^{16}$ cm$^{-3}$ and not higher than $3.0 \times 10^{19}$ cm$^{-3}$ and C atoms at a concentration not lower than $1.0 \times 10^{15}$ cm$^{-3}$ and not higher than $5.0 \times 10^{17}$ cm$^{-3}$. Since an average dislocation density in GaAs crystal substrate 11 is varied by a concentration of contained Si atoms and C atoms, the crack defect ratio can be lowered by adjusting, at a prescribed concentration of Si atoms or C atoms, the average dislocation density in any of the first flat region and the first notch region to be within a prescribed range. GaAs crystal substrate 11 has a semiconducting property provided with n-type conductivity with increase in concentration of contained Si atoms, and at a concentration of Si atoms not lower than $3.0 \times 10^{16}$ cm$^{-3}$ and not higher than $3.0 \times 10^{19}$ cm$^{-3}$, the GaAs crystal substrate has a carrier concentration approximately not lower than $1.0 \times 10^{16}$ cm$^{-3}$ and not higher than $1.0 \times 10^{19}$ cm$^{-3}$. GaAs crystal substrate 11 has a semiconducting property provided with an insulating property with increase in concentration of contained C atoms, and at a concentration of C atoms not lower than $1.0 \times 10^{15}$ cm$^{-3}$ and not higher than $5.0 \times 10^{17}$ cm$^{-3}$, the GaAs crystal substrate has resistivity approximately not lower than $1.0 \times 10^{7}$ Ω·cm and not higher than $5.0 \times 10^{8}$ Ω·cm.

From a point of view of lowering in crack defect ratio of GaAs crystal substrate 11 in the present embodiment in manufacturing of the substrate and in growth of an epitaxial layer on the substrate, in any of first flat region 11$fr$ extending over width WR from flat portion 11$f$ to a position at a distance of 2 mm in the direction perpendicular to the straight line indicating flat portion 11$f$ in the main surface and first notch region 11$nr$ extending over width WR from notch portion 11$n$ to a position at a distance of 2 mm in the direction perpendicular to the curve indicating notch portion 11$n$ in the main surface, when GaAs crystal substrate 11 contains Si atoms at the concentration above, it has an average dislocation density not lower than 0 cm$^{-2}$ and not higher than 15000 cm$^{-2}$, and when the GaAs crystal substrate contains C atoms at the concentration above, the GaAs crystal substrate has an average dislocation density not lower than 3000 cm$^{-2}$ and not higher than 20000 cm$^{-2}$.

From a point of view of further lowering in crack defect ratio of GaAs crystal substrate 11 in the present embodiment in manufacturing of the substrate and in growth of an epitaxial layer on the substrate, in any of second flat region 11$fr$ extending over width WR from flat portion 11$f$ to a position at a distance of 1 mm in the direction perpendicular to the straight line indicating flat portion 11$f$ in the main surface and second notch region 11$nr$ extending over width WR from notch portion 11$n$ to the position at a distance of 1 mm in the direction perpendicular to the curve indicating notch portion 11$n$ in the main surface, when GaAs crystal substrate 11 contains Si atoms at the concentration above, it has an average dislocation density not lower than 0 cm$^{-2}$ and not higher than 15000 cm$^{-2}$, and when the GaAs crystal substrate contains C atoms at the concentration above, it has an average dislocation density not lower than 3000 cm$^{-2}$ and not higher than 20000 cm$^{-2}$.

The second flat region and the second notch region are partial regions closer to flat portion 11$f$ and notch portion 11$n$ in the first flat region and the first notch region, respectively. The second flat region and the second notch region which are parts of the first flat region and the first notch region on a side of the outer circumferential portion may be higher in average dislocation density than the first flat region and the first notch region, respectively. Since crack originates from the outer circumferential portion, a value of the average dislocation density in the second flat region affects more on the crack defect ratio. Therefore, the GaAs crystal substrate having the average dislocation density within the range above also in the second flat region and the second notch region which may be high in average dislocation density is lower in crack defect ratio in manufacturing of the substrate and in growth of an epitaxial layer on the substrate.

Figure 3A:
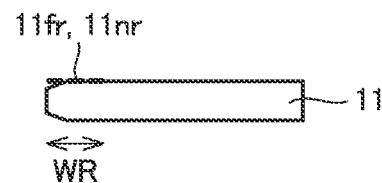
FIG. 3A is an enlarged schematic cross-sectional view showing an exemplary portion of measurement of an average dislocation density in the gallium arsenide crystal substrate according to one manner of the present invention.
Figure 3B:
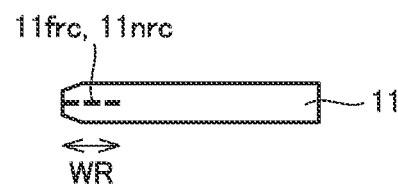
FIG. 3B is an enlarged schematic cross-sectional view showing another exemplary portion of measurement of an average dislocation density in the gallium arsenide crystal substrate according to one manner of the present invention.

FIGS. 3A and 3B are enlarged schematic cross-sectional views showing an exemplary portion of measurement of an average dislocation density in GaAs crystal substrate 11 in the present embodiment. Referring to FIG. 3A, an average dislocation density in GaAs crystal substrate 11 is measured by using a microscope, as an average per unit area of etch pits (etch pit average density) produced in the main surface in first or second flat region 11$fr$ or first or second notch region 11$nr$ after immersion of GaAs crystal substrate 11 for ten minutes in a potassium hydroxide (KOH) melt at 500° C. Etch pits, however, may not be visible in a beveled portion of the flat portion in first or second flat region 11$fr$ or a beveled portion of the notch portion in first or second notch region 11$nr$. In this case, referring to FIG. 3B, an average density of etch pits produced by performing treatment under conditions the same as above onto a first or second flat region 11$frc$ in a central portion or a first or second notch region 11$nrc$ in a central portion exposed by grinding the main surface in first or second flat region 11$fr$ or first or second notch region 11$nr$ toward the central portion of the substrate is measured.

Though a length LR of flat portion 11$f$ is not particularly restricted, from a point of view of enhanced visibility and machine recognizability as well as securing a region from which a chip is taken, an OF length not shorter than 40 mm and not longer than 65 mm and an IF length not shorter than 20 mm and not longer than 45 mm are preferred. A GaAs crystal substrate having a diameter of six inches more preferably has an OF length not shorter than 43 mm and not longer than 53 mm and an IF length not shorter than 25 mm and not longer than 35 mm. A GaAs crystal substrate having a diameter of eight inches more preferably has an OF length not shorter than 52 mm and not longer than 63 mm and an IF length not shorter than 32 mm and not longer than 43 mm.

From a point of view of enhanced visibility and machine recognizability as well as securing a region from which a chip is taken, a notch in notch portion 11$n$ is shaped preferably by cutting off a portion having a size not smaller than 0.5 mm and not greater than 1.5 mm from the outer edge toward the center at an opening angle not smaller than 85° and not greater than 95° and more preferably by cutting off a portion having a size not smaller than 1.00 mm and not greater than 1.25 mm from the outer edge toward the center at an opening angle not smaller than 89° and not greater than 95°, and the direction of the central cut of the notch is preferably set to a [010] direction when viewed from the center.

Embodiment I-2

Referring to FIGS. 1A, 1B, 2A, and 2B, GaAs crystal substrate 11 in the present embodiment includes a main surface having a diameter not smaller than 150 mm and not greater than 205 mm and a thickness not smaller than 300 μm and not greater than 800 μm. A part of the outer edge of GaAs crystal substrate 11 includes any of flat portion 11f and notch portion 11n. GaAs crystal substrate 11 contains any of Si atoms at a concentration not lower than $3.0 \times 10^{16}$ cm$^{-3}$ and not higher than $3.0 \times 10^{19}$ cm$^{-3}$ and C atoms at a concentration not lower than $1.0 \times 10^{15}$ cm$^{-3}$ and not higher than $5.0 \times 10^{17}$ cm$^{-3}$. In any of first flat region 11fr extending over width WR from flat portion 11f to a position at a distance of 2 mm in the direction perpendicular to the straight line indicating flat portion 11f in the main surface and first notch region 11nr extending over width WR from notch portion 11n to a position at a distance of 2 mm in the direction perpendicular to the curve indicating notch portion 11n in the main surface, GaAs crystal substrate 11 has average residual strain not less than $2 \times 10^{-6}$ and not more than $1 \times 10^{-4}$. Since GaAs crystal substrate 11 in the present embodiment has average residual strain within a prescribed range in any of first flat region 11fr and first notch region 11nr, it is low in crack defect ratio in manufacturing of the substrate and in growth of an epitaxial layer on the substrate.

"Being perpendicular to the curve indicating the notch portion in the main surface" in the GaAs crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaAs crystal substrate, a type (Si atoms or C atoms) or a concentration of contained atoms, or a difference in manufacturing of a substrate or growth of an epitaxial layer, and being low in crack defect ratio means a relatively low crack defect ratio so long as a diameter of the GaAs crystal substrate, a type (Si atoms or C atoms) or a concentration of contained atoms, and manufacturing of the substrate or growth of an epitaxial layer are identical.

Since the diameter not smaller than 150 mm and not greater than 205 mm, the thickness not smaller than 300 μm and not greater than 800 μm, Si atoms at the concentration not lower than $3.0 \times 10^{16}$ cm$^{-3}$ and not higher than $3.0 \times 10^{19}$ cm$^{-3}$, and C atoms at the concentration not lower than $1.0 \times 10^{15}$ cm$^{-3}$ and not higher than $5.0 \times 10^{17}$ cm$^{-3}$, of GaAs crystal substrate 11 in the present embodiment are the same as the diameter not smaller than 150 mm and not greater than 205 mm, the thickness not smaller than 300 μm and not greater than 800 μm, Si atoms at the concentration not lower than $3.0 \times 10^{16}$ cm$^{-3}$ and not higher than $3.0 \times 10^{19}$ cm$^{-3}$, and C atoms at the concentration not lower than $1.0 \times 10^{15}$ cm$^{-3}$ and not higher than $5.0 \times 10^{17}$ cm$^{-3}$, of GaAs crystal substrate 11 in Embodiment I-1, respectively, description will not be repeated. Since average residual strain in any of the first flat region and the first notch region of GaAs crystal substrate 11 is varied by a concentration of contained Si atoms and C atoms, the crack defect ratio can be lowered by adjusting, at a prescribed concentration of Si atoms or C atoms, average residual strain in any of the first flat region and the first notch region to be within a prescribed range.

From a point of view of lowering in crack defect ratio in manufacturing of the substrate and in growth of an epitaxial layer on the substrate, GaAs crystal substrate 11 in the present embodiment has average residual strain not less than $2 \times 10^{-6}$ and not more than $1 \times 10^{-4}$ in any of first flat region 11fr extending over width WR from flat portion 11f to a position at a distance of 2 mm in the direction perpendicular to the straight line indicating flat portion 11f in the main surface and first notch region 11nr extending over width WR from notch portion 11n to a position at a distance of 2 mm in the direction perpendicular to the curve indicating notch portion 11n in the main surface.

From a point of view of further lowering in crack defect ratio in manufacturing of the substrate and in growth of an epitaxial layer on the substrate, GaAs crystal substrate 11 in the present embodiment preferably has average residual strain not less than $2 \times 10^{-6}$ and not more than $1 \times 10^{-4}$ in any of second flat region 11fr extending over width WR from flat portion 11f to a position at a distance of 1 mm in the direction perpendicular to the straight line indicating flat portion 11f in the main surface and second notch region 11nr extending over width WR from notch portion 11n to a position at a distance of 1 mm in the direction perpendicular to the curve indicating notch portion 11n in the main surface.

The second flat region and the second notch region are partial regions closer to flat portion 11f and notch portion 11n in the first flat region and the first notch region, respectively. The second flat region and the second notch region which are parts of the first flat region and the first notch region on the outer circumferential side may be greater in average residual strain than the first flat region and the first notch region, respectively. Since crack originates from the outer circumferential portion, a value of average residual strain in the second flat region more affects the crack defect ratio. Therefore, the GaAs crystal substrate having the average residual strain within the range above also in the second flat region and the second notch region which may be great in average residual strain is lower in crack defect ratio in manufacturing of the substrate and in growth of an epitaxial layer on the substrate.

Figure 4:
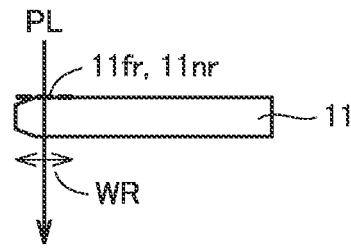
FIG. 4 is an enlarged schematic cross-sectional view showing an exemplary portion of measurement of average residual strain in the gallium arsenide crystal substrate according to one manner of the present invention.

FIG. 4 is an enlarged schematic cross-sectional view showing an exemplary portion of measurement of average residual strain in GaAs crystal substrate 11 in the present embodiment. Referring to FIG. 4, in specific regions each having a prescribed size and distributed evenly at prescribed pitches over the entire mirror-finished main surface in first or second flat region 11fr or first or second notch region 11nr of GaAs crystal substrate 11, polarized light PL having a wavelength of 1.3 μm is transmitted perpendicularly to the main surface. Intensity of transmitted light obtained by synchronized rotation of a polarizer and an analyzer arranged in front and rear of a sample is collected as a function of a polarization angle φ. Phase retardation of birefringence and an orientation of a principal axis can be found based on polarization angle φ and intensity of transmitted light to find an in-plane strain component. Absolute values at points, of differences in elongation and contraction strain in a direction of radius and a direction of a tangential line in a cylindrical coordinate system are averaged and calculated as average residual strain.

Since length LR (an OF length and an IF length) of flat portion 11f and the shape and the direction of the central cut of the notch of notch portion 11n of GaAs crystal substrate 11 in the present embodiment are the same as length LR (an OF length and an IF length) of flat portion 11f and the shape and the direction of the central cut of the notch of notch portion 11n of GaAs crystal substrate 11 in Embodiment I-1, respectively, description will not be repeated.

Embodiment I-3

Referring to FIGS. 1A, 1B, 2A, and 2B, GaAs crystal substrate 11 in the present embodiment includes a main surface having a diameter not smaller than 150 mm and not greater than 205 mm and a thickness not smaller than 300 μm and not greater than 800 μm. A part of the outer edge of GaAs crystal substrate 11 includes any of flat portion 11f and notch portion 11n. GaAs crystal substrate 11 contains any of Si atoms at a concentration not lower than $3.0 \times 10^{16}$ $cm^{-3}$ and not higher than $3.0 \times 10^{19}$ $cm^{-3}$ and C atoms at a concentration not lower than $1.0 \times 10^{15}$ $cm^{-3}$ and not higher than $5.0 \times 10^{17}$ $cm^{-3}$. In any of first flat region 11fr extending over width WR from flat portion 11f to a position at a distance of 2 mm in the direction perpendicular to the straight line indicating flat portion 11f in the main surface and first notch region 11nr extending over width WR from notch portion 11n to a position at a distance of 2 mm in the direction perpendicular to the curve indicating notch portion 11n in the main surface, when GaAs crystal substrate 11 contains Si atoms, GaAs crystal substrate 11 preferably has an average dislocation density not lower than 0 $cm^{-2}$ and not higher than 15000 $cm^{-2}$ and average residual strain not less than $2 \times 10^{-6}$ and not more than $1 \times 10^{-4}$, and when GaAs crystal substrate 11 contains C atoms, GaAs crystal substrate 11 preferably has an average dislocation density not lower than 3000 $cm^{-2}$ and not higher than 20000 $cm^{-2}$ and average residual strain not less than $2 \times 10^{-6}$ and not more than $1 \times 10^{-4}$ Since GaAs crystal substrate 11 in the present embodiment has an average dislocation density and average residual strain within respective prescribed ranges in any of first flat region 11fr and first notch region 11nr, it is lower in crack defect ratio in manufacturing of the substrate and in growth of an epitaxial layer on the substrate.

"Being perpendicular to the curve indicating the notch portion in the main surface" in the GaAs crystal substrate in the present embodiment means being perpendicular to a tangential line at each point on the curve indicating the notch portion in the main surface. The "curve" here means a line not being straight at least in part and may include a straight line in part. The crack defect ratio is varied by a diameter of the GaAs crystal substrate, a type (Si atoms or C atoms) or a concentration of contained atoms, or a difference in manufacturing of a substrate or growth of an epitaxial layer, and being lower in crack defect ratio means a relatively lower crack defect ratio so long as a diameter of the GaAs crystal substrate, a type (Si atoms or C atoms) or a concentration of contained atoms, and manufacturing of the substrate or growth of an epitaxial layer are identical.

Since the diameter not smaller than 150 mm and not greater than 205 mm, the thickness not smaller than 300 μm and not greater than 800 μm, Si atoms at the concentration not lower than $3.0 \times 10^{16}$ $cm^{-3}$ and not higher than $3.0 \times 10^{19}$ $cm^{-3}$, and C atoms at the concentration not lower than $1.0 \times 10^{15}$ $cm^{-3}$ and not higher than $5.0 \times 10^{17}$ $cm^{-3}$, of GaAs crystal substrate 11 in the present embodiment are the same as the diameter not smaller than 150 mm and not greater than 205 mm, the thickness not smaller than 300 μm and not greater than 800 μm, Si atoms at the concentration not lower than $3.0 \times 10^{16}$ $cm^{-3}$ and not higher than $3.0 \times 10^{19}$ $cm^{-3}$, and C atoms at the concentration not lower than $1.0 \times 10^{15}$ $cm^{-3}$ and not higher than $5.0 \times 10^{17}$ $cm^{-3}$, of GaAs crystal substrate 11 in Embodiments I-1 and I-2, respectively, description will not be repeated. Since the average dislocation density and the average residual strain in any of the first flat region and the first notch region of GaAs crystal substrate 11 are varied by the concentration of contained Si atoms and C atoms, the crack defect ratio can be lowered by adjusting, at a prescribed concentration of Si atoms or C atoms, the average dislocation density and the average residual strain in any of the first flat region and the first notch region to be within prescribed ranges.

From a point of view of lowering in crack defect ratio in manufacturing of the substrate and in growth of an epitaxial layer on the substrate in GaAs crystal substrate 11 in the present embodiment, in any of first flat region 11fr extending over width WR from flat portion 11f to a position at a distance of 2 mm in the direction perpendicular to the straight line indicating flat portion 11f in the main surface and first notch region 11nr extending over width WR from notch portion 11n to a position at a distance of 2 mm in the direction perpendicular to the curve indicating notch portion 11n in the main surface, when GaAs crystal substrate 11 contains Si atoms at the concentration above, it preferably has an average dislocation density not lower than 0 $cm^{-2}$ and not higher than 15000 $cm^{-2}$ and average residual strain not less than $2 \times 10^{-6}$ and not more than $1 \times 10^{-4}$, and when the GaAs crystal substrate contains C atoms at the concentration above, it preferably has an average dislocation density not lower than 3000 $cm^{-2}$ and not higher than 20000 $cm^{-2}$ and average residual strain not less than $2 \times 10^{-6}$ and not more than $1 \times 10^{-4}$. The average dislocation density in GaAs crystal substrate 11 is measured as in Embodiment I-1 and the average residual strain in GaAs crystal substrate 11 is measured as in Embodiment I-2.

From a point of view of further lowering in crack defect ratio in manufacturing of the substrate and in growth of an epitaxial layer on the substrate in GaAs crystal substrate 11 in the present embodiment, in any of second flat region 11fr extending over width WR from flat portion 11f to a position at a distance of 1 mm in the direction perpendicular to the straight line indicating flat portion 11f in the main surface and second notch region 11nr extending over width WR from notch portion 11n to a position at a distance of 1 mm in the direction perpendicular to the curve indicating notch portion 11n in the main surface, when GaAs crystal substrate 11 contains Si atoms at the concentration above, it more preferably has an average dislocation density not lower than 0 $cm^{-2}$ and not higher than 15000 $cm^{-2}$ and average residual strain not less than $2 \times 10^{-6}$ and not more than $1 \times 10^{-4}$, and when the GaAs crystal substrate contains C atoms at the concentration above, it more preferably has an average dislocation density not lower than 3000 $cm^{-2}$ and not higher than 20000 $cm^{-2}$ and average residual strain not less than $2 \times 10^{-6}$ and not more than $1 \times 10^{-4}$.

The second flat region and the second notch region are partial regions closer to flat portion 11f and notch portion 11n in the first flat region and the first notch region, respectively. The second flat region and the second notch region which are parts of the first flat region and the first notch region on the outer circumferential side may be higher in average dislocation density and average residual strain than the first flat region and the first notch region, respectively. Since crack originates from the outer circumferential portion, values of the average dislocation density and the average residual strain in the second flat region more affects the crack defect ratio. Therefore, the GaAs crystal substrate having the average dislocation density and the average residual strain within the ranges above also in the second flat region and the second notch region which may be high in average dislocation density and average residual strain is lower in crack defect ratio in manufacturing of the substrate and in growth of an epitaxial layer on the substrate.

Since length LR (an OF length and an IF length) of flat portion 11*f* and the shape and the direction of the central cut of the notch of notch portion 11*n* in GaAs crystal substrate 11 in the present embodiment are the same as length LR (an OF length and an IF length) of flat portion 11*f* and the shape and the direction of the central cut of the notch of notch portion 11*n* in GaAs crystal substrate 11 in Embodiments I-1 and I-2, respectively, description will not be repeated.

<Method of Manufacturing GaAs Crystal Substrate>

Figure 5A:
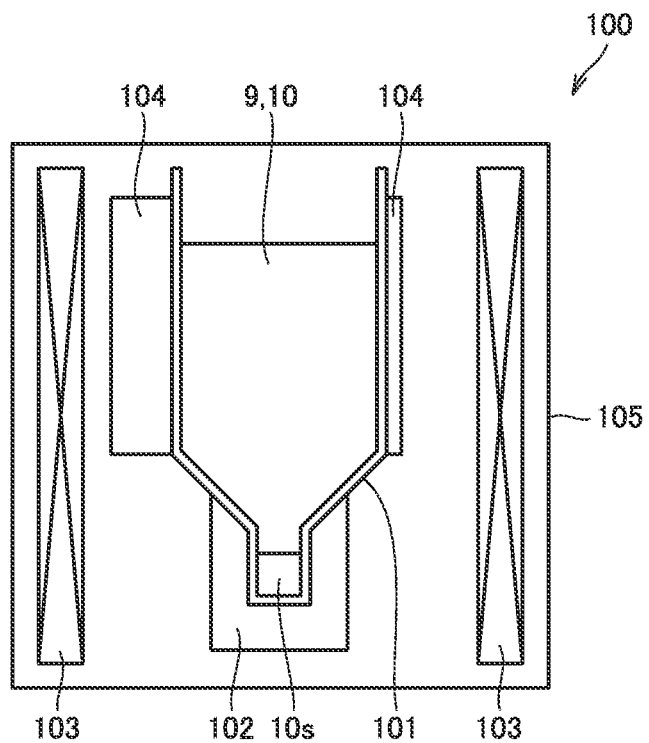
FIG. 5A is a schematic vertical cross-sectional view of the inside of a manufacturing apparatus showing an exemplary method of manufacturing a gallium arsenide crystal substrate according to one manner of the present invention.
Figure 5B:
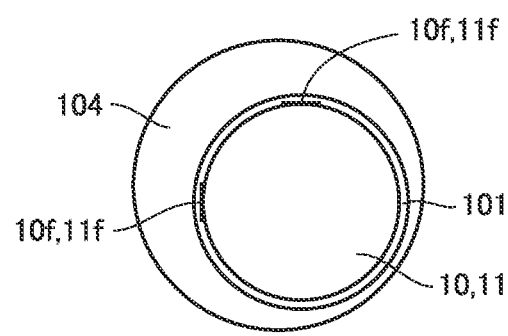
FIG. 5B is a schematic horizontal cross-sectional view of a heat-insulating material and the inside of a crucible showing an exemplary method of manufacturing a gallium arsenide crystal substrate according to one manner of the present invention.
Figure 6A:
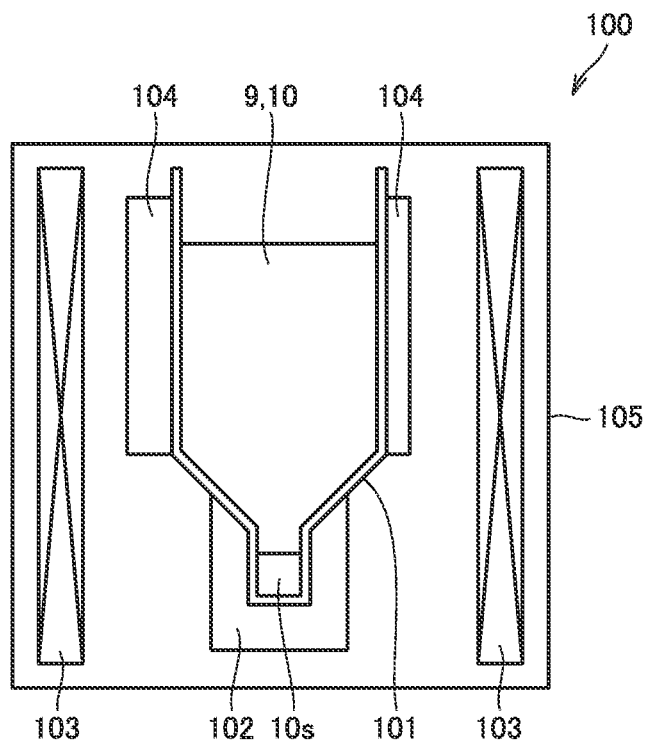
FIG. 6A is a schematic vertical cross-sectional view of the inside of a manufacturing apparatus showing another exemplary method of manufacturing a gallium arsenide crystal substrate according to one manner of the present invention.
Figure 6B:
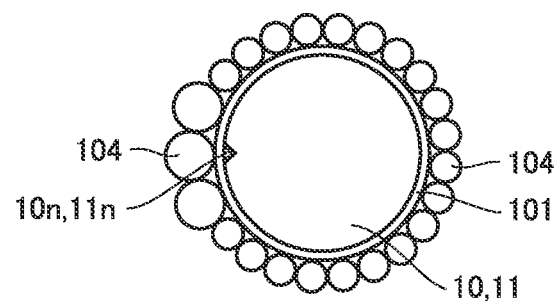
FIG. 6B is a schematic horizontal cross-sectional view of a heat-insulating material and the inside of a crucible showing another exemplary method of manufacturing a gallium arsenide crystal substrate according to one manner of the present invention.
Figure 7A:
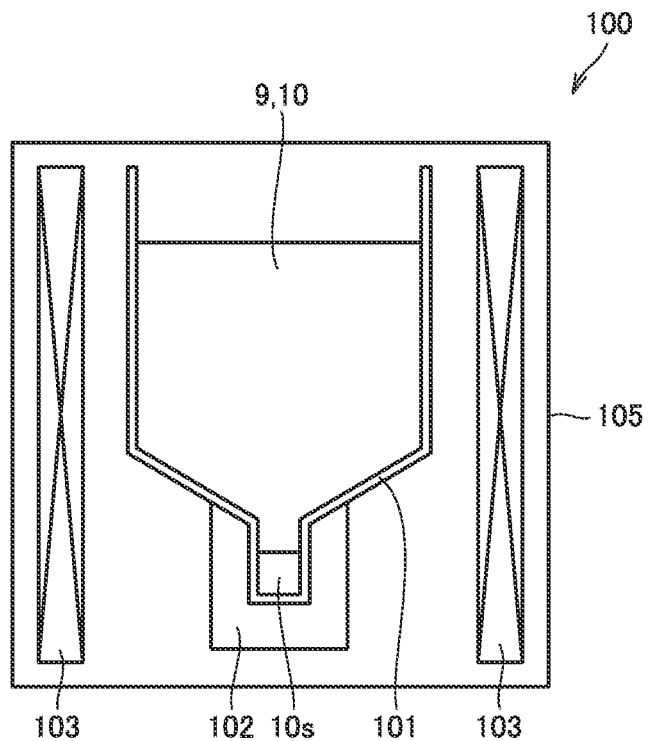
FIG. 7A is a schematic vertical cross-sectional view of the inside of a manufacturing apparatus showing yet another exemplary method of manufacturing a gallium arsenide crystal substrate according to one manner of the present invention.
Figure 7B:
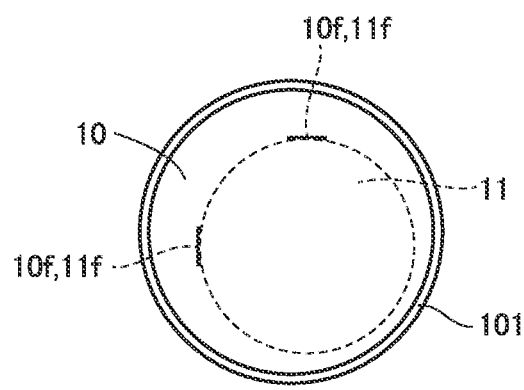
FIG. 7B is a schematic horizontal cross-sectional view of the inside of a crucible showing yet another exemplary method of manufacturing a gallium arsenide crystal substrate according to one manner of the present invention.
Figure 8:
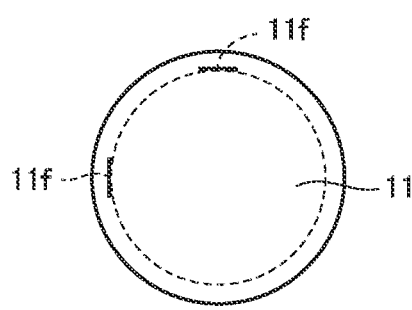
FIG. 8 is a schematic plan view showing still another exemplary method of manufacturing a gallium arsenide crystal substrate according to one manner of the present invention.
Figure 8:
Figure 8:
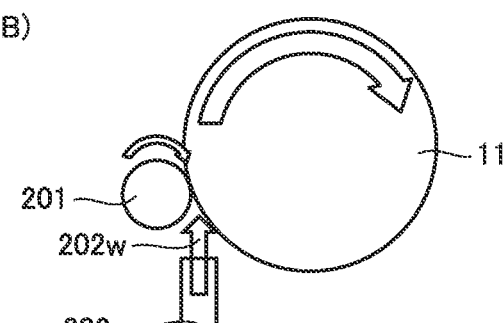
Figure 8:
Figure 8:
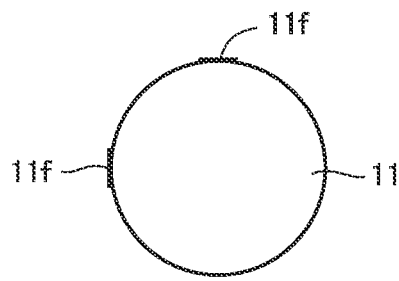

FIGS. 5A, 5B, 6A, 6B, 7A, and 7B are schematic cross-sectional views showing an exemplary method of manufacturing GaAs crystal substrate 11 in Embodiments I-1 to I-3. FIGS. 5A, 6A, and 7A are schematic vertical cross-sectional views of the inside of a manufacturing apparatus and FIGS. 5B, 6B, and 7B are schematic horizontal cross-sectional views of a heat-insulating material and the inside of a crucible. FIG. 8 is a schematic plan view showing another exemplary method of manufacturing GaAs crystal substrate 11 in Embodiments I-1 to I-3.

Referring to FIGS. 5A, 5B, 6A, 6B, 7A, 7B, and 8, a general method of manufacturing GaAs crystal substrate 11 includes growing crystals by a vertical boat method such as the vertical Bridgman (VB) method and the vertical gradient freeze (VGF) method by using a crystal growth apparatus 100 including a crucible 101, a crucible base 102, and a heater 103 arranged in a pressure vessel 105. Initially, a GaAs seed crystal 10*s* and a GaAs source material 9 are arranged in crucible 101. Then, by adjusting a temperature of heater 103 and vertically moving crucible 101, GaAs source material 9 is molten. A GaAs crystalline body 10 is grown by solidifying molten GaAs source material 9 from a side of GaAs seed crystal 10*s* (FIGS. 5A, 5B, 6A, and 6B). Then, GaAs crystalline body 10 is cooled. Then, cooled GaAs crystalline body 10 is taken out of crucible 101. Then, GaAs crystal substrate 11 is cut from taken GaAs crystalline body 10 (FIGS. 7A and 7B). Then, by grinding and/or polishing an outer edge (outer circumference) of cut GaAs crystal substrate 11, any of flat portion 11*f* and notch portion 11*n* is formed in a part of the outer edge (outer circumference) of GaAs crystal substrate 11 (FIG. 8). A main surface of GaAs crystal substrate 11 having any of flat portion 11*f* and notch portion 11*n* formed in a part of the outer edge (outer circumference) is mirror polished.

Embodiment II-1

Referring to FIGS. 5A, 5B, 6A, and 6B, in the method of manufacturing GaAs crystal substrate 11 in the present embodiment, a heat-insulating material 104 including a portion high in insulation and a portion low in insulation is arranged on an outer side of an outer circumference of crucible 101 in growing and cooling GaAs crystalline body 10 or in cooling GaAs crystalline body 10 (that is, at least in cooling of GaAs crystalline body 10) in the general manufacturing method. In GaAs crystalline body 10, a temperature difference between a portion to subsequently be any of flat portion 11*f* and notch portion 11*n* of GaAs crystal substrate 11 (such a portion also being referred to as an intended flat portion 10*f* and an intended notch portion 10*n* of GaAs crystalline body 10, to be understood similarly below) and a portion to be an inner side of GaAs crystal substrate 11 (such a portion also being referred to as an intended inner substrate portion of GaAs crystalline body 10, to be understood similarly below) is thus suppressed, so that a crystal defect such as dislocation and strain in first and second flat regions 11*fr* and first and second notch regions 11*nr* in GaAs crystal substrate 11 are lessened and an average dislocation density and average residual strain in first and second flat regions 11*fr* and first and second notch regions 11*nr* can be adjusted to be within prescribed ranges.

Arrangement of heat-insulating material 104 is not particularly restricted. From the points of view above, however, the portion high in insulation of heat-insulating material 104 is preferably arranged on the outer side of the outer edge (outer circumference) of any of intended flat portion 10*f* and intended notch portion 10*n* of GaAs crystalline body 10 (that is, a portion to be any of flat portion 11*f* and notch portion 11*n* of GaAs crystal substrate 11). For example, a portion in heat-insulating material 104 on the outer side of the outer edge (outer circumference) of any of intended flat portion 10*f* and intended notch portion 10*n* of GaAs crystalline body 10 is preferably larger in thickness or made of a material higher in insulation than a portion other than that.

Heat-insulating material 104 may be an integrated material as shown in FIGS. 5A and 5B or an assembly of a plurality of components as shown in FIGS. 6A and 6B. When heat-insulating material 104 is an integrated material, the portion of heat-insulating material 104 located on the outer side of the outer edge (outer circumference) of any of intended flat portion 10*f* and intended notch portion 10*n* of GaAs crystalline body 10 is preferably greater in thickness (FIGS. 5A and 5B) or made of a material higher in insulation than a portion other than that. When heat-insulating material 104 is an assembly of a plurality of components, the component of heat-insulating material 104 located on the outer side of the outer edge (outer circumference) of any of intended flat portion 10*f* and intended notch portion 10*n* of GaAs crystalline body 10 is preferably greater in thickness (FIGS. 6A and 6B) or made of a material higher in insulation than a portion other than that.

Though a material for heat-insulating material 104 is not particularly restricted so long as it achieves a heat insulating effect, a carbon material, ceramics, silicon nitride (SiN), silicon carbide (SiC), quartz, and a cylindrical container filled with gallium arsenide (GaAs) are preferred.

Embodiment II-2

Referring to FIGS. 7A and 7B, in the method of manufacturing GaAs crystal substrate 11 in the present embodiment, in cutting GaAs crystal substrate 11 from taken GaAs crystalline body 10 in the general manufacturing method, the GaAs crystal substrate is cut such that a portion of GaAs crystal substrate 11 where any of flat portion 11*f* and notch portion 11*n* is to be formed is located in the inside as being more distant from the outer edge (outer circumference) of GaAs crystalline body 10 than other portions. Thus, a temperature difference between a portion of the GaAs crystal substrate where any of flat portion 11*f* and notch portion 11*n* is to be formed and a portion on the inner side in GaAs crystal substrate 11 can be suppressed so that a crystal defect such as dislocation and strain in first and second flat regions 11*fr* and first and second notch regions 11*nr* of GaAs crystal substrate 11 can be lessened and an average dislocation density and average residual strain in first and second flat regions 11*fr* and first and second notch regions 11*nr* can be adjusted to be within prescribed ranges.

Embodiment II-3

Referring to FIG. 8, in the method of manufacturing GaAs crystal substrate 11 in the present embodiment, in forming any of flat portion 11f and notch portion 11n in a part of the outer edge (outer circumference) of GaAs crystal substrate 11 by grinding and/or polishing the outer edge (outer circumference) of cut GaAs crystal substrate 11 in the general manufacturing method, a temperature is adjusted to remove heat generated in formation of any of flat portion 11f and notch portion 11n. Thus, a temperature difference between a portion of the GaAs crystal substrate where any of flat portion 11f and notch portion 11n is formed and a portion on the inner side of GaAs crystal substrate 11 can be suppressed so that a crystal defect such as dislocation and strain in first and second flat regions 11fr and first and second notch regions 11nr of GaAs crystal substrate 11 can be lessened and an average dislocation density and average residual strain in first and second flat regions 11fr and first and second notch regions 11nr can be adjusted to be within prescribed ranges.

The method of grinding and/or polishing the outer edge (outer circumference) of cut GaAs crystal substrate 11 is not particularly restricted, and a grindstone 201 as shown, for example, in FIG. 8 can be employed. The method of adjusting a temperature for removing heat generated in formation of any of flat portion 11f and notch portion 11n is not particularly restricted, and a method of increasing an amount of cooling water 202w injected from a cooling water container 202u and/or a method of lowering a temperature of cooling water 202w only when any of flat portion 11f and notch portion 11n is formed in a part of the outer edge (outer circumference) of GaAs crystal substrate 11 are/is available.

In the method of manufacturing GaAs crystal substrate 11 in Embodiments II-1 to II-3, by combining the method of manufacturing GaAs crystal substrate 11 in Embodiment II-1 with the method of manufacturing GaAs crystal substrate 11 in Embodiment II-3 or by combining the method of manufacturing GaAs crystal substrate 11 in Embodiment II-2 with the method of manufacturing GaAs crystal substrate 11 in Embodiment 11-3, a temperature difference between a portion of the GaAs crystal substrate where any of flat portion 11f and notch portion 11n is formed and a portion on the inner side of GaAs crystal substrate 11 can further be suppressed and a crystal defect such as dislocation and strain in first and second flat regions 11fr and first and second notch regions 11nr of GaAs crystal substrate 11 can further be lessened, so that an average dislocation density and average residual strain in first and second flat regions 11fr and first and second notch regions can be adjusted to be within prescribed ranges.

Examples

Experimental Example 1

GaAs crystal substrate 11 including a main surface having a plane orientation of (100), including two flat portions 11f of orientation flat (OF) having a length of 48 mm and identification flat (IF) having a length of 30 mm in an outer edge, and having a diameter of six inches (152.4 mm), a thickness of 650 μm, and an Si atomic concentration of $3.0 \times 10^{16}$ cm$^{-3}$ was fabricated by using a crystal growth apparatus shown in FIGS. 5A and 5B. An average dislocation density and average residual strain in first flat region 11fr (a region extending over a width from flat portion 11f to a position at a distance of 2 mm in the direction perpendicular to the straight line indicating flat portion 11f in the main surface) were measured and a crack defect ratio in polishing of the GaAs crystal substrate and in growth of a GaAs layer having a thickness of 5 μm which is an epitaxial layer on the GaAs crystal substrate after polishing of the GaAs crystal substrate was calculated. Specific description is as follows.

1. Growth of GaAs Crystalline Body

GaAs crystalline body 10 was grown by the VB method shown in FIGS. 5A and 5B. In such crystal growth, heat-insulating material 104 as an integrated material was arranged around crucible 101 during growth of crystals by melting and solidification of a source material and cooling of grown crystals. Heat-insulating material 104 was formed of solid carbon, and the heat-insulating material was large in thickness in a portion located on the outer side of intended flat portion 10f of GaAs crystalline body 10 and small in thickness in a portion located on the outer side of a portion other than intended flat portion 10f of GaAs crystalline body 10. Thus, the average dislocation density and the average residual strain in the first flat region of obtained GaAs crystal substrate 11 could be adjusted to be within prescribed ranges. GaAs crystalline body 10 which had undergone crystal growth and cooling was taken out of the crucible.

2. Fabrication of GaAs Crystal Substrate

GaAs crystal substrate 11 was cut from taken GaAs crystalline body 10. By grinding and polishing the outer edge (outer circumference) of cut GaAs crystal substrate 11, two flat portions 11f of OF having a length of 48 mm and IF having a length of 30 mm were formed in a part of the outer edge (outer circumference) of GaAs crystal substrate 11. An amount of cooling water 202w injected from cooling water container 202u was increased only while flat portion 11f was formed. Thus, the average dislocation density and the average residual strain in the first flat region of obtained GaAs crystal substrate 11 could be adjusted to be within prescribed ranges.

3. Evaluation of Average Dislocation Density

The main surface of obtained GaAs crystal substrate 11 was mirror-polished, and thereafter the GaAs crystal substrate was immersed for ten minutes in a potassium hydroxide (KOH) melt at 500° C. Thereafter, the average dislocation density was measured by using a microscope, as an average per unit area of etch pits (etch pit average density) produced in first flat region 11fr (a region extending over a width from flat portion 11f to a position at a distance of 2 mm in the direction perpendicular to the straight line indicating flat portion 11f in the main surface) in the main surface.

In Experimental Examples including the present Experimental Example, the average dislocation density in first or second flat region 11fr or first or second notch region 11nr in the main surface is the same as the average dislocation density in first flat region 11frc or first notch region 11nrc in the central portion exposed by grinding.

4. Evaluation of Average Residual Strain

After the main surface of obtained GaAs crystal substrate 11 was mirror-polished, incident light having a beam diameter of 100 μm and a wavelength of 1.3 μm was transmitted perpendicularly to the main surface, to points arranged at pitches of 200 μm over the entire main surface in mirror-polished first flat region 11fr (a region extending over a width from flat portion 11f to a position at a distance of 2 mm in the direction perpendicular to the straight line indicating flat portion 11f in the main surface). Phase retardation of birefringence and an orientation of a principal axis of a sample were calculated based on relation between obtained intensity of transmitted light and a polarization angle. Absolute values of differences in elongation and contraction strain in a direction of radius and a direction of a tangential line at those points in a cylindrical coordinate system were calculated, and an average of the absolute values of the differences in elongation and contraction strain at those points was calculated as the average residual strain.

5. Evaluation of Crack Defect Ratio

The crack defect ratio refers to a percentage of samples where crack occurred with respect to the total number of samples in manufacturing of a substrate and in growth of an epitaxial layer below.

(1) In Manufacturing of Substrate

A crack defect ratio of obtained GaAs crystal substrate 11 was calculated at the time when the GaAs crystal substrate was subjected to double-sided polishing as primary polishing for 90 minutes under such conditions as the number of rotations of an upper surface of 10 rpm, the number of rotations of a lower surface of 30 rpm, carrier revolution of 10 rpm, and carrier rotation of 5 rpm with an abrasive containing colloidal silica being dropped at 900 cm$^3$/minute and with the use of a polishing cloth of a nonwoven type and subjected to single-sided polishing as finishing polishing for three minutes under such conditions as the number of rotations of the upper surface of 150 rpm and the number of rotations of the lower surface of 150 rpm with an abrasive not containing colloidal silica being dropped at 1000 cm$^3$/minute and with the use of a polishing cloth of a suede type.

(2) In Growth of Epitaxial Layer

A crack defect ratio of obtained GaAs crystal substrate 11 was calculated after it was subjected to primary polishing and finishing polishing and thereafter a GaAs layer having a thickness of 5 μm was grown as an epitaxial layer on the main surface subjected to finishing polishing by metal-organic chemical vapor deposition (MOCVD) under such conditions as a temperature of a crystal growth atmosphere of 600° C., a pressure of the crystal growth atmosphere of 50 Torr, and a V/III ratio (representing a ratio of a molarity of a V group element to a molarity of a III group element, to be understood similarly below) of 100.

Table 1 summarizes a crack defect ratio in manufacturing of the substrate and Table 2 summarizes a crack defect ratio in growth of the epitaxial layer, in combinations of Examples where the average dislocation density in the first flat region was from 0 cm$^{-2}$ to 15000 cm$^{-2}$ and Comparative Example where the average dislocation density in the first flat region was 54000 cm$^{-2}$ with Examples where the average residual strain in the first flat region was from $2.0\times10^{-6}$ to $1.0\times10^{-4}$ and Comparative Examples where the average residual strain in the first flat region was $1.0\times10^{-6}$ and $3.0\times10^{-4}$ in the present Experimental Example (Experimental Example 1).

TABLE 1

| Crack Defect Ratio (%) in Manufacturing of Substrate [Si Concentration: $3.0 \times 10^{16}$ cm$^{-3}$] [Diameter: 6 inches] | | Average Dislocation Density (cm$^{-2}$) | | | | |
|---|---|---|---|---|---|---|
| [First Flat Region] | | 0 | 10 | 2000 | 15000 | 54000 |
| Average Residual Strain | $1.0 \times 10^{-6}$ | 2.2 | 2.4 | 2.0 | 2.8 | 3.8 |
| | $2.0 \times 10^{-6}$ | 1.2 | 0.8 | 1.5 | 1.3 | 2.6 |
| | $1.5 \times 10^{-5}$ | 0.9 | 0.8 | 0.7 | 0.8 | 2.7 |
| | $7.0 \times 10^{-5}$ | 0.8 | 1.2 | 1.3 | 0.8 | 2.9 |
| | $1.0 \times 10^{-4}$ | 1.2 | 1.3 | 1.4 | 0.9 | 2.2 |
| | $3.0 \times 10^{-4}$ | 2.6 | 2.4 | 2.7 | 2.9 | 4.3 |

Experimental Example 2

TABLE 2

| Crack Defect Ratio (%) in Epitaxial Layer Growth [Si Concentration: $3.0 \times 10^{16}$ cm$^{-3}$] [Diameter: 6 inches] | | Average Dislocation Density (cm$^{-2}$) | | | | |
|---|---|---|---|---|---|---|
| [First Flat Region] | | 0 | 10 | 2000 | 15000 | 54000 |
| Average Residual Strain | $1.0 \times 10^{-6}$ | 1.2 | 1.5 | 1.3 | 1.3 | 3.5 |
| | $2.0 \times 10^{-6}$ | 0.6 | 0.8 | 0.7 | 0.3 | 1.7 |
| | $1.5 \times 10^{-5}$ | 0.8 | 0.5 | 0.3 | 0.7 | 1.6 |
| | $7.0 \times 10^{-5}$ | 0.6 | 0.5 | 0.8 | 0.8 | 1.5 |
| | $1.0 \times 10^{-4}$ | 0.6 | 0.6 | 0.4 | 0.4 | 1.3 |
| | $3.0 \times 10^{-4}$ | 1.3 | 1.4 | 1.8 | 1.7 | 2.5 |

The GaAs crystal substrate was fabricated, the average dislocation density and the average residual strain in the first flat region were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 1 except for setting an Si atomic concentration to $1.0\times10^{17}$ cm$^{-3}$. Table 3 summarizes a crack defect ratio in manufacturing of the substrate and Table 4 summarizes a crack defect ratio in growth of the epitaxial layer, in combinations of Examples where the average dislocation density in the first flat region was from 0 cm$^{-2}$ to 14000 cm$^{-2}$ and Comparative Example where the average dislocation density in the first flat region was 40000 cm$^{-2}$ with Examples where the average residual strain in the first flat region was from $2.2\times10^{-6}$ to $9.5\times10^{-5}$ and Comparative Examples where the average residual strain in the first flat region was $1.0\times10^{-6}$ and $4.0\times10^{-4}$ in the present Experimental Example (Experimental Example 2).

TABLE 3

| Crack Defect Ratio (%) in Manufacturing of Substrate [Si Concentration: $1.0 \times 10^{17}$ cm$^{-3}$] [Diameter: 6 inches] | | Average Dislocation Density (cm$^{-2}$) | | | | |
|---|---|---|---|---|---|---|
| [First Flat Region] | | 0 | 20 | 1200 | 14000 | 40000 |
| Average Residual Strain | $1.0 \times 10^{-6}$ | 2.8 | 2.2 | 2.5 | 2.4 | 3.6 |
| | $2.2 \times 10^{-6}$ | 0.8 | 1.5 | 0.5 | 1.2 | 2.8 |
| | $1.0 \times 10^{-5}$ | 1.2 | 1.4 | 1.3 | 1.5 | 2.6 |
| | $6.0 \times 10^{-5}$ | 0.9 | 1.1 | 1.0 | 1.5 | 2.2 |
| | $9.5 \times 10^{-5}$ | 1.3 | 1.5 | 1.3 | 1.0 | 2.9 |
| | $4.0 \times 10^{-4}$ | 2.5 | 2.9 | 2.8 | 2.4 | 3.3 |

TABLE 4

| Crack Defect Ratio (%) in Epitaxial Layer Growth [Si Concentration: $1.0 \times 10^{17}$ cm$^{-3}$] [Diameter: 6 inches] | | Average Dislocation Density (cm$^{-2}$) | | | | |
|---|---|---|---|---|---|---|
| [First Flat Region] | | 0 | 20 | 1200 | 14000 | 40000 |
| Average Residual Strain | $1.0 \times 10^{-6}$ | 1.2 | 1.8 | 1.6 | 1.5 | 2.5 |
| | $2.2 \times 10^{-6}$ | 0.5 | 0.6 | 0.8 | 0.7 | 1.7 |
| | $1.0 \times 10^{-5}$ | 0.9 | 0.6 | 0.8 | 0.5 | 1.5 |
| | $6.0 \times 10^{-5}$ | 0.5 | 0.7 | 0.6 | 0.8 | 1.9 |
| | $9.5 \times 10^{-5}$ | 0.8 | 0.7 | 0.6 | 0.2 | 1.5 |
| | $4.0 \times 10^{-4}$ | 1.5 | 1.6 | 1.4 | 1.9 | 2.8 |

Experimental Example 3

The GaAs crystal substrate was fabricated, the average dislocation density and the average residual strain in the first flat region were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 1 except for setting an Si atomic concentration to $1.0 \times 10^{18}$ cm$^{-3}$. Table 5 summarizes a crack defect ratio in manufacturing of the substrate and Table 6 summarizes a crack defect ratio in growth of the epitaxial layer, in combinations of Examples where the average dislocation density in the first flat region was from 0 cm$^{-2}$ to 15000 cm$^{-2}$ and Comparative Example where the average dislocation density in the first flat region was 70000 cm$^{-2}$ with Examples where the average residual strain in the first flat region was from $2.5 \times 10^{-6}$ to $1.0 \times 10^{-4}$ and Comparative Examples where the average residual strain in the first flat region was $1.5 \times 10^{-6}$ and $2.0 \times 10^{-4}$ in the present Experimental Example (Experimental Example 3).

TABLE 5

| Crack Defect Ratio (%) in Manufacturing of Substrate [Si Concentration: $1.0 \times 10^{18}$ cm$^{-3}$] [Diameter: 6 inches] | | Average Dislocation Density (cm$^{-2}$) | | | | |
|---|---|---|---|---|---|---|
| [First Flat Region] | | 0 | 50 | 2800 | 15000 | 70000 |
| Average Residual Strain | $1.5 \times 10^{-6}$ | 2.2 | 2.4 | 2.6 | 2.8 | 3.9 |
| | $2.5 \times 10^{-6}$ | 0.7 | 0.5 | 1.2 | 1.0 | 2.8 |
| | $1.2 \times 10^{-5}$ | 1.0 | 0.8 | 1.0 | 1.4 | 2.2 |
| | $8.0 \times 10^{-5}$ | 0.8 | 0.7 | 1.2 | 0.9 | 2.7 |
| | $1.0 \times 10^{-4}$ | 1.1 | 1.0 | 1.1 | 0.8 | 2.8 |
| | $2.0 \times 10^{-4}$ | 2.7 | 2.4 | 2.7 | 2.9 | 3.6 |

TABLE 6

| Crack Defect Ratio (%) in Epitaxial Layer Growth [Si Concentration: $1.0 \times 10^{18}$ cm$^{-3}$] [Diameter: 6 inches] | | Average Dislocation Density (cm$^{-2}$) | | | | |
|---|---|---|---|---|---|---|
| [First Flat Region] | | 0 | 50 | 2800 | 15000 | 70000 |
| Average Residual Strain | $1.5 \times 10^{-6}$ | 1.6 | 1.3 | 1.7 | 1.9 | 2.7 |
| | $2.5 \times 10^{-6}$ | 0.8 | 0.5 | 0.5 | 0.3 | 1.3 |
| | $1.2 \times 10^{-5}$ | 0.6 | 0.5 | 0.8 | 0.7 | 1.8 |
| | $8.0 \times 10^{-5}$ | 0.9 | 0.2 | 0.6 | 0.4 | 1.6 |
| | $1.0 \times 10^{-4}$ | 0.5 | 0.7 | 0.8 | 0.7 | 1.4 |
| | $2.0 \times 10^{-4}$ | 1.5 | 1.8 | 1.5 | 1.7 | 2.6 |

Experimental Example 4

The GaAs crystal substrate was fabricated, the average dislocation density and the average residual strain in the first flat region were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 1 except for setting an Si atomic concentration to $3.0 \times 10^{19}$ cm$^{-3}$. Table 7 summarizes a crack defect ratio in manufacturing of the substrate and Table 8 summarizes a crack defect ratio in growth of the epitaxial layer, in combinations of Examples where the average dislocation density in the first flat region was from 0 cm$^{-2}$ to 14500 cm$^{-2}$ and Comparative Example where the average dislocation density in the first flat region was 38000 cm$^{-2}$ with Examples where the average residual strain in the first flat region was from $2.0 \times 10^{-6}$ to $8.0 \times 10^{-5}$ and Comparative Examples where the average residual strain in the first flat region was $1.0 \times 10^{-6}$ and $3.5 \times 10^{-4}$ in the present Experimental Example (Experimental Example 4).

TABLE 7

| Crack Defect Ratio (%) in Manufacturing of Substrate [Si Concentration: $3.0 \times 10^{19}$ cm$^{-3}$] [Diameter: 6 inches] | | Average Dislocation Density (cm$^{-2}$) | | | | |
|---|---|---|---|---|---|---|
| [First Flat Region] | | 0 | 30 | 1200 | 14500 | 38000 |
| Average Residual Strain | $1.0 \times 10^{-6}$ | 2.5 | 2.7 | 2.8 | 2.6 | 4.5 |
| | $2.0 \times 10^{-6}$ | 1.5 | 1.0 | 1.1 | 0.8 | 2.2 |
| | $9.0 \times 10^{-6}$ | 1.0 | 0.5 | 1.4 | 1.2 | 2.8 |
| | $7.5 \times 10^{-5}$ | 0.8 | 1.3 | 0.8 | 1.0 | 2.6 |
| | $8.0 \times 10^{-5}$ | 0.6 | 0.8 | 1.2 | 1.4 | 2.5 |
| | $3.5 \times 10^{-4}$ | 2.5 | 2.7 | 2.6 | 2.9 | 3.6 |

TABLE 8

| Crack Defect Ratio (%) in Epitaxial Layer Growth [Si Concentration: $3.0 \times 10^{19}$ cm$^{-3}$] [Diameter: 6 inches] | | Average Dislocation Density (cm$^{-2}$) | | | | |
|---|---|---|---|---|---|---|
| [First Flat Region] | | 0 | 30 | 1200 | 14500 | 38000 |
| Average Residual Strain | $1.0 \times 10^{-6}$ | 1.5 | 1.5 | 1.7 | 1.6 | 2.5 |
| | $2.0 \times 10^{-6}$ | 0.6 | 0.8 | 0.9 | 0.4 | 1.5 |
| | $9.0 \times 10^{-6}$ | 0.9 | 0.5 | 0.5 | 0.7 | 1.7 |
| | $7.5 \times 10^{-5}$ | 0.8 | 0.6 | 0.5 | 0.8 | 1.6 |
| | $8.0 \times 10^{-5}$ | 0.7 | 0.6 | 0.3 | 0.4 | 1.9 |
| | $3.5 \times 10^{-4}$ | 1.4 | 1.8 | 1.6 | 1.7 | 2.4 |

Experimental Example 5

GaAs crystal substrate 11 was fabricated, the average dislocation density and the average residual strain in first notch region 11nr (a region extending over a width from notch portion 11n to a position at a distance of 2 mm in the direction perpendicular to the curve indicating notch portion 11n in the main surface) were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 1 except for setting a C atomic concentration to $1 \times 10^{15}$ cm$^{-3}$ instead of the Si atomic concentration of $3 \times 10^{16}$ cm$^{-3}$ and machining the notch portion by cutting off a portion extending by 1.0 mm from the outer edge toward the center at an opening angle of 90° in a [010] direction when the direction of the central cut of the notch was viewed from the center of the substrate. Table 9 summarizes a crack defect ratio in manufacturing of the substrate and Table 10 summarizes a crack defect ratio in growth of the epitaxial layer, in combinations of Examples where the average dislocation density in the first notch region was from 3000 cm$^{-2}$ to 20000 cm$^{-2}$ and Comparative Examples where the average dislocation density in the first notch region was 1700 cm$^{-2}$ and 75000 cm$^{-2}$ with Examples where the average residual strain in the first notch region was from $2 \times 10^{-6}$ to $1.0 \times 10^{-4}$ and Comparative Examples where the average residual strain in the first notch region was $1.0 \times 10^{-6}$ and $3.0 \times 10^{-4}$ in the present Experimental Example (Experimental Example 5).

TABLE 9

Crack Defect Ratio (%) in
Manufacturing of Substrate
[C Concentration: $1.0 \times 10^{15}$ cm$^{-3}$]
[Diameter: 6 inches]

| | [First Notch Region] | Average Dislocation Density (cm$^{-2}$) | | | | |
|---|---|---|---|---|---|---|
| | | 1700 | 3000 | 7800 | 20000 | 75000 |
| Average Residual Strain | $1.0 \times 10^{-6}$ | 3.5 | 2.2 | 2.8 | 2.4 | 3.3 |
| | $2.0 \times 10^{-6}$ | 2.2 | 1.3 | 1.5 | 1.2 | 2.9 |
| | $1.5 \times 10^{-5}$ | 2.6 | 1.5 | 1.3 | 1.5 | 2.5 |
| | $7.0 \times 10^{-5}$ | 2.1 | 1.4 | 1.2 | 1.4 | 2.8 |
| | $1.0 \times 10^{-4}$ | 2.7 | 1.2 | 1.3 | 1.0 | 2.5 |
| | $3.0 \times 10^{-4}$ | 3.8 | 2.7 | 2.8 | 2.5 | 4.0 |

TABLE 10

Crack Defect Ratio (%) in
Epitaxial Layer Growth
[C Concentration: $1.0 \times 10^{15}$ cm$^{-3}$]
[Diameter: 6 inches]

| | [First Notch Region] | Average Dislocation Density (cm$^{-2}$) | | | | |
|---|---|---|---|---|---|---|
| | | 1700 | 3000 | 7800 | 20000 | 75000 |
| Average Residual Strain | $1.0 \times 10^{-6}$ | 2.0 | 1.6 | 1.8 | 1.4 | 2.4 |
| | $2.0 \times 10^{-6}$ | 1.5 | 0.6 | 0.5 | 0.6 | 1.4 |
| | $1.5 \times 10^{-5}$ | 1.2 | 0.7 | 0.5 | 0.7 | 1.9 |
| | $7.0 \times 10^{-5}$ | 1.6 | 0.3 | 0.8 | 0.4 | 1.2 |
| | $1.0 \times 10^{-4}$ | 1.7 | 0.4 | 0.7 | 0.5 | 1.5 |
| | $3.0 \times 10^{-4}$ | 2.8 | 1.4 | 1.8 | 1.2 | 3.0 |

Experimental Example 6

The GaAs crystal substrate was fabricated, the average dislocation density and the average residual strain in the first notch region were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 5 except for setting a C atomic concentration to $2.0 \times 10^{16}$ cm$^{-3}$. Table 11 summarizes a crack defect ratio in manufacturing of the substrate and Table 12 summarizes a crack defect ratio in growth of the epitaxial layer, in combinations of Examples where the average dislocation density in the first notch region was from 3300 cm$^{-2}$ to 18000 cm$^{-2}$ and Comparative Examples where the average dislocation density in the first notch region was 1200 cm$^{-2}$ and 50000 cm$^{-2}$ with Examples where the average residual strain in the first notch region was from $2.1 \times 10^{-6}$ to $9.0 \times 10^{-5}$ and Comparative Examples where the average residual strain in the first notch region was $1.5 \times 10^{-6}$ and $3.0 \times 10^{-4}$ in the present Experimental Example (Experimental Example 6).

TABLE 11

Crack Defect Ratio (%) in
Manufacturing of Substrate
[C Concentration: $2.0 \times 10^{16}$ cm$^{-3}$]
[Diameter: 6 inches]

| | [First Notch Region] | Average Dislocation Density (cm$^{-2}$) | | | | |
|---|---|---|---|---|---|---|
| | | 1200 | 3300 | 5600 | 18000 | 50000 |
| Average Residual Strain | $1.5 \times 10^{-6}$ | 3.6 | 2.5 | 2.2 | 2.9 | 3.4 |
| | $2.1 \times 10^{-6}$ | 2.4 | 1.3 | 1.2 | 1.4 | 2.2 |
| | $1.0 \times 10^{-5}$ | 2.6 | 1.1 | 1.5 | 1.0 | 2.7 |
| | $4.0 \times 10^{-5}$ | 2.9 | 1.4 | 1.4 | 1.3 | 2.6 |
| | $9.0 \times 10^{-5}$ | 2.2 | 1.1 | 1.5 | 1.4 | 2.5 |
| | $3.0 \times 10^{-4}$ | 4.7 | 2.5 | 2.2 | 2.8 | 4.2 |

TABLE 12

Crack Defect Ratio (%) in
Epitaxial Layer Growth
[C Concentration: $2.0 \times 10^{16}$ cm$^{-3}$]
[Diameter: 6 inches]

| | [First Notch Region] | Average Dislocation Density (cm$^{-2}$) | | | | |
|---|---|---|---|---|---|---|
| | | 1200 | 3300 | 5600 | 18000 | 50000 |
| Average Residual Strain | $1.5 \times 10^{-6}$ | 2.8 | 1.5 | 1.9 | 1.4 | 2.5 |
| | $2.1 \times 10^{-6}$ | 1.2 | 0.4 | 0.8 | 0.8 | 1.5 |
| | $1.0 \times 10^{-5}$ | 1.7 | 0.5 | 0.6 | 0.6 | 1.7 |
| | $4.0 \times 10^{-5}$ | 1.2 | 0.7 | 0.5 | 0.7 | 1.8 |

TABLE 12-continued

| Crack Defect Ratio (%) in Epitaxial Layer Growth [C Concentration: $2.0 \times 10^{16}$ cm$^{-3}$] [Diameter: 6 inches] | Average Dislocation Density (cm$^{-2}$) | | | | |
|---|---|---|---|---|---|
| [First Notch Region] | 1200 | 3300 | 5600 | 18000 | 50000 |
| $9.0 \times 10^{-5}$ | 1.6 | 0.4 | 0.7 | 0.6 | 1.6 |
| $3.0 \times 10^{-4}$ | 2.4 | 1.7 | 1.2 | 1.8 | 2.9 |

Experimental Example 7

The GaAs crystal substrate was fabricated, the average dislocation density and the average residual strain in the first notch region were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 5 except for setting a C atomic concentration to $5.0 \times 10^{17}$ cm$^{-3}$. Table 13 summarizes a crack defect ratio in manufacturing of the substrate and Table 14 summarizes a crack defect ratio in growth of the epitaxial layer, in Examples where the average dislocation density in the first notch region was from 3100 cm$^{-2}$ to 19000 cm$^{-2}$ and Comparative Examples where the average dislocation density in the first notch region was 1700 cm$^{-2}$ and 32000 cm$^{-2}$ and Examples where the average residual strain in the first notch region was from $3.0 \times 10^{-6}$ to $1.0 \times 10^{-4}$ and Comparative Examples where the average residual strain in the first notch region was $1.9 \times 10^{-6}$ and $3.0 \times 10^{-4}$ in the present Experimental Example (Experimental Example 7).

Experimental Example 8

GaAs crystal substrate 11 including a main surface having a plane orientation of (100), including notch portion 11n machined into a shape by cutting off a portion extending by 1.0 mm from the outer edge toward the center at an opening angle of 90° in a [010] direction when the direction of the central cut of the notch was viewed from the center of the substrate, and having a diameter of eight inches (203.2 mm), a thickness of 750 μm, and an Si atomic concentration of $1.5 \times 10^{18}$ cm$^{-3}$ was fabricated by using a crystal growth apparatus shown in FIGS. 6A and 6B. An average dislocation density and average residual strain in first notch region 11nr were measured and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated. Specific description is as follows.

1. Growth of GaAs Crystalline Body

GaAs crystalline body 10 was grown by the VB method shown in FIGS. 6A and 6B. Heat-insulating material 104 as an assembly of a plurality of components was arranged around crucible 101 during growth of crystals by melting and solidification of a source material and cooling of grown

TABLE 13

| Crack Defect Ratio (%) in Manufacturing of Substrate [C Concentration: $5.0 \times 10^{17}$ cm$^{-3}$] [Diameter: 6 inches] | | Average Dislocation Density (cm$^{-2}$) | | | | |
|---|---|---|---|---|---|---|
| [First Notch Region] | | 1700 | 3100 | 6000 | 19000 | 32000 |
| Average Residual Strain | $1.9 \times 10^{-6}$ | 3.8 | 2.5 | 2.6 | 2.8 | 3.5 |
| | $3.0 \times 10^{-6}$ | 2.8 | 1.3 | 1.2 | 1.5 | 2.5 |
| | $2.0 \times 10^{-5}$ | 2.5 | 1.1 | 1.4 | 1.2 | 2.8 |
| | $8.0 \times 10^{-5}$ | 2.3 | 1.5 | 1.3 | 1.0 | 2.6 |
| | $1.0 \times 10^{-4}$ | 2.3 | 1.4 | 1.3 | 1.1 | 2.5 |
| | $3.0 \times 10^{-4}$ | 4.4 | 2.4 | 2.6 | 2.3 | 4.2 |

TABLE 14

| Crack Defect Ratio (%) in Epitaxial Layer Growth [C Concentration: $5.0 \times 10^{17}$ cm$^{-3}$] [Diameter: 6 inches] | | Average Dislocation Density (cm$^{-2}$) | | | | |
|---|---|---|---|---|---|---|
| [First Notch Region] | | 1700 | 3100 | 6000 | 19000 | 32000 |
| Average Residual Strain | $1.9 \times 10^{-6}$ | 2.5 | 1.5 | 1.7 | 1.7 | 2.5 |
| | $3.0 \times 10^{-6}$ | 1.5 | 0.5 | 0.8 | 0.8 | 1.5 |
| | $2.0 \times 10^{-5}$ | 1.8 | 0.8 | 0.7 | 0.6 | 1.7 |
| | $8.0 \times 10^{-5}$ | 1.6 | 0.8 | 0.8 | 0.4 | 1.8 |
| | $1.0 \times 10^{-4}$ | 1.8 | 0.7 | 0.6 | 0.4 | 1.5 |
| | $3.0 \times 10^{-4}$ | 2.7 | 1.9 | 1.8 | 1.6 | 2.7 | crystals. Heat-insulating material 104 was composed of solid carbon covered with pyrolytic boron nitride (pBN), and a component thereof large in thickness was located on the outer side of intended notch portion 10n of GaAs crystalline body 10 and a component thereof small in thickness was located on the outer side of a portion other than intended notch portion 10n of GaAs crystalline body 10. The average dislocation density and the average residual strain in obtained GaAs crystal substrate 11 could thus be adjusted to be within prescribed ranges. GaAs crystalline body 10 which had undergone crystal growth and cooling was taken out of the crucible.

2. Fabrication of GaAs Crystal Substrate

GaAs crystal substrate 11 was cut from taken GaAs crystalline body 10. By grinding and polishing the outer edge (outer circumference) of cut GaAs crystal substrate 11, notch portion 11n machined into a shape by cutting off a portion extending by 1.0 mm from the outer edge toward the center at an opening angle of 90° in a [010] direction when the direction of the central cut of the notch was viewed from the center of the substrate was provided in a part of the outer edge (outer circumference) of GaAs crystal substrate 11. An amount of cooling water 202w injected from cooling water container 202u was increased only while notch portion 11n was provided. The average dislocation density and the average residual strain in the first notch region in obtained GaAs crystal substrate 11 could thus be adjusted to be within prescribed ranges.

The average dislocation density, the average residual strain, and the crack defect ratio of obtained GaAs crystal substrate 11 were evaluated as in Experimental Example 1. Table 15 summarizes a crack defect ratio in manufacturing of the substrate and Table 16 summarizes a crack defect ratio in growth of the epitaxial layer, in combinations of Examples where the average dislocation density in the first notch region was from 0 cm$^{-2}$ to 14500 cm$^{-2}$ and Comparative Example where the average dislocation density in the first notch region was 30000 cm$^{-2}$ with Examples where the average residual strain in the first notch region was from $2.0 \times 10^{-6}$ to $9.0 \times 10^{-5}$ and Comparative Examples where the average residual strain in the first notch region was $1.0 \times 10^{-6}$ and $2.0 \times 10^{-4}$ in the present Experimental Example (Experimental Example 8).

TABLE 15

| Crack Defect Ratio (%) in Manufacturing of Substrate [Si Concentration: $1.5 \times 10^{18}$ cm$^{-3}$] [Diameter: 8 inches] | | Average Dislocation Density (cm$^{-2}$) | | | | |
|---|---|---|---|---|---|---|
| [First Notch Region] | | 0 | 60 | 2000 | 14500 | 30000 |
| Average Residual Strain | $1.0 \times 10^{-6}$ | 4.1 | 4.0 | 3.7 | 4.5 | 5.4 |
| | $2.0 \times 10^{-6}$ | 2.8 | 2.5 | 2.6 | 2.3 | 3.8 |
| | $2.0 \times 10^{-5}$ | 2.5 | 2.8 | 2.7 | 2.7 | 3.7 |
| | $7.0 \times 10^{-5}$ | 2.0 | 2.5 | 2.3 | 2.6 | 4.0 |
| | $9.0 \times 10^{-5}$ | 2.7 | 2.3 | 2.1 | 2.8 | 3.8 |
| | $2.0 \times 10^{-4}$ | 3.8 | 3.5 | 4.0 | 4.3 | 6.0 |

TABLE 16

| Crack Defect Ratio (%) in Epitaxial Layer Growth [Si Concentration: $1.5 \times 10^{18}$ cm$^{-3}$] [Diameter: 8 inches] | | Average Dislocation Density (cm$^{-2}$) | | | | |
|---|---|---|---|---|---|---|
| [First Notch Region] | | 0 | 60 | 2000 | 14500 | 30000 |
| Average Residual Strain | $1.0 \times 10^{-6}$ | 2.6 | 2.6 | 2.8 | 2.9 | 3.8 |
| | $2.0 \times 10^{-6}$ | 1.8 | 1.5 | 1.8 | 1.6 | 2.4 |

TABLE 16-continued

| Crack Defect Ratio (%) in Epitaxial Layer Growth [Si Concentration: $1.5 \times 10^{18}$ cm$^{-3}$] [Diameter: 8 inches] | | Average Dislocation Density (cm$^{-2}$) | | | | |
|---|---|---|---|---|---|---|
| [First Notch Region] | | 0 | 60 | 2000 | 14500 | 30000 |
| | $2.0 \times 10^{-5}$ | 1.7 | 1.6 | 1.3 | 1.8 | 2.8 |
| | $7.0 \times 10^{-5}$ | 1.3 | 1.7 | 1.6 | 1.4 | 2.6 |
| | $9.0 \times 10^{-5}$ | 1.8 | 1.0 | 1.8 | 1.7 | 2.3 |
| | $2.0 \times 10^{-4}$ | 2.5 | 2.8 | 2.5 | 2.8 | 4.0 |

As shown in Experimental Examples 1 to 8, it can be seen that the crack defect ratio in manufacturing of the substrate and in growth of the epitaxial layer on the substrate is low in the GaAs crystal substrate having a diameter not smaller than 150 mm and not greater than 205 mm and a thickness not smaller than 300 μm and not greater than 800 μm and including any of the flat portion and the notch portion in a part of the outer edge thereof when a concentration of Si atoms is not lower than $3.0 \times 10^{16}$ cm$^{-3}$ and not higher than $3.0 \times 10^{19}$ cm$^{-3}$ and when the average dislocation density is not lower than 0 cm$^{-2}$ and not higher than 15000 cm$^{-2}$ or the average residual strain is not less than $2 \times 10^{-6}$ and not more than $1 \times 10^{-4}$ in any of the first flat region and the first notch region and when a concentration of C atoms is not lower than $1.0 \times 10^{15}$ cm$^{-3}$ and not higher than $5.0 \times 10^{17}$ cm$^{-3}$ and when the average dislocation density is not lower than 3000 cm$^{-2}$ and not higher than 20000 cm$^{-2}$ or the average residual strain is not less than $2 \times 10^{-6}$ and not more than $1 \times 10^{-4}$ in any of the first flat region and the first notch region.

Furthermore, it can be seen that the crack defect ratio in manufacturing of the substrate and in growth of the epitaxial layer on the substrate is lower in the GaAs crystal substrate above when a concentration of Si atoms is not lower than $3.0 \times 10^{16}$ cm$^{-3}$ and not higher than $3.0 \times 10^{19}$ cm$^{-3}$ and when the average dislocation density is not lower than 0 cm$^{-2}$ and not higher than 15000 cm$^{-2}$ and the average residual strain is not less than $2 \times 10^{-6}$ and not more than $1 \times 10^{-4}$ in any of the first flat region and the first notch region and when a concentration of C atoms is not lower than $1.0 \times 10^{15}$ cm$^{-3}$ and not higher than $5.0 \times 10^{17}$ cm$^{-3}$ and when the average dislocation density is not lower than 3000 cm$^{-2}$ and not higher than 20000 cm$^{-2}$ and the average residual strain is not less than $2 \times 10^{-6}$ and not more than $1 \times 10^{-4}$ in any of the first flat region and the first notch region.

Experimental Example 9

The GaAs crystal substrate was fabricated, the average dislocation density and the average residual strain in the second flat region (a region extending over a width from the flat portion to a position at a distance of 1 mm in the direction perpendicular to the straight line indicating the flat portion in the main surface) were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 3 except for setting a thickness of a heat-insulating material located on the outer side of the intended flat portion of the GaAs crystalline body to twice as large as the thickness in Experimental Example 3. Table 17 summarizes a crack defect ratio in manufacturing of the substrate and Table 18 summarizes a crack defect ratio in growth of the epitaxial layer, in combinations of Examples where the average dislocation density in the second flat region was from 0 cm$^{-2}$ to 15000 cm$^{-2}$ and Comparative Example where the average dislocation density in the second flat region was 70000 cm$^{-2}$ with Examples where the average residual strain in the second flat region was from 2.5×10$^{-6}$ to 1.0×10$^{-4}$ and Comparative Examples where the average residual strain in the second flat region was 1.5×10$^{-6}$ and 2.0×10$^{-4}$ in the present Experimental Example (Experimental Example 9).

TABLE 17

Crack Defect Ratio (%) in Manufacturing of Substrate
[Si Concentration: 1.0 × 10$^{18}$ cm$^{-3}$]
[Diameter: 6 inches]

| [Second Flat Region] | | Average Dislocation Density (cm$^{-2}$) | | | | |
|---|---|---|---|---|---|---|
| | | 0 | 50 | 2800 | 15000 | 70000 |
| Average Residual Strain | 1.5 × 10$^{-6}$ | 1.0 | 1.2 | 1.4 | 1.4 | 1.8 |
| | 2.5 × 10$^{-6}$ | 0.5 | 0.2 | 0.6 | 0.6 | 1.4 |
| | 1.2 × 10$^{-5}$ | 0.5 | 0.4 | 0.5 | 0.6 | 1.0 |
| | 8.0 × 10$^{-5}$ | 0.4 | 0.3 | 0.6 | 0.5 | 1.4 |
| | 1.0 × 10$^{-4}$ | 0.5 | 0.5 | 0.5 | 0.4 | 1.4 |
| | 2.0 × 10$^{-4}$ | 1.3 | 1.3 | 1.2 | 1.3 | 1.8 |

TABLE 18

Crack Defect Ratio (%) in Epitaxial Layer Growth
[Si Concentration: 1.0 × 10$^{18}$ cm$^{-3}$]
[Diameter: 6 inches]

| [Second Flat Region] | | Average Dislocation Density (cm$^{-2}$) | | | | |
|---|---|---|---|---|---|---|
| | | 0 | 50 | 2800 | 15000 | 70000 |
| Average Residual Strain | 1.5 × 10$^{-6}$ | 0.8 | 0.6 | 0.8 | 1.0 | 1.3 |
| | 2.5 × 10$^{-6}$ | 0.4 | 0.2 | 0.2 | 0.1 | 0.6 |
| | 1.2 × 10$^{-5}$ | 0.3 | 0.2 | 0.4 | 0.3 | 0.9 |
| | 8.0 × 10$^{-5}$ | 0.4 | 0.1 | 0.3 | 0.2 | 0.8 |
| | 1.0 × 10$^{-4}$ | 0.2 | 0.3 | 0.4 | 0.3 | 0.7 |
| | 2.0 × 10$^{-4}$ | 0.8 | 0.9 | 0.7 | 0.8 | 1.3 |

Experimental Example 10

The GaAs crystal substrate was fabricated, the average dislocation density and the average residual strain in the second notch region (a region extending over a width from the notch portion to a position at a distance of 1 mm in the direction perpendicular to the curve indicating the notch portion in the main surface) were measured, and a crack defect ratio in polishing of the GaAs crystal substrate and in growth of the GaAs layer having a thickness of 5 μm which was the epitaxial layer on the GaAs crystal substrate after polishing of the GaAs crystal substrate was calculated as in Experimental Example 6 except for setting a thickness of a heat-insulating material located on the outer side of the intended notch portion of the GaAs crystalline body to twice as large as the thickness in Experimental Example 6. Table 19 summarizes a crack defect ratio in manufacturing of the substrate and Table 20 summarizes a crack defect ratio in growth of the epitaxial layer, in combinations of Examples where the average dislocation density in the second notch region was from 3300 cm$^{-2}$ to 18000 cm$^{-2}$ and Comparative Examples where the average dislocation density in the second notch region was 1200 cm$^{-2}$ and 50000 cm$^{-2}$ with Examples where the average residual strain in the second notch region was from 2.1×10$^{-6}$ to 9.0×10$^{-5}$ and Comparative Examples where the average residual strain in the second notch region was 1.5×10$^{-6}$ and 3.0×10$^{-4}$ in the present Experimental Example (Experimental Example 10).

TABLE 19

Crack Defect Ratio (%) in Manufacturing of Substrate
[C Concentration: 2.0 × 10$^{16}$ cm$^{-3}$]
[Diameter: 6 inches]

| [Second Notch Region] | | Average Dislocation Density (cm$^{-2}$) | | | | |
|---|---|---|---|---|---|---|
| | | 1200 | 3300 | 5600 | 18000 | 50000 |
| Average Residual Strain | 1.5 × 10$^{-6}$ | 1.8 | 1.3 | 1.1 | 1.5 | 1.7 |
| | 2.1 × 10$^{-6}$ | 1.2 | 0.7 | 0.6 | 0.7 | 1.1 |
| | 1.0 × 10$^{-5}$ | 1.3 | 0.6 | 0.8 | 0.5 | 1.4 |
| | 4.0 × 10$^{-5}$ | 1.5 | 0.7 | 0.7 | 0.7 | 1.3 |
| | 9.0 × 10$^{-5}$ | 1.1 | 0.6 | 0.8 | 0.7 | 1.3 |
| | 3.0 × 10$^{-4}$ | 2.3 | 1.3 | 1.1 | 1.4 | 2.2 |

TABLE 20

Crack Defect Ratio (%) in Epitaxial Layer Growth
[C Concentration: 2.0 × 10$^{16}$ cm$^{-3}$]
[Diameter: 6 inches]

| [Second Notch Region] | | Average Dislocation Density (cm$^{-2}$) | | | | |
|---|---|---|---|---|---|---|
| | | 1200 | 3300 | 5600 | 18000 | 50000 |
| Average Residual Strain | 1.5 × 10$^{-6}$ | 1.4 | 0.8 | 0.9 | 0.7 | 1.3 |
| | 2.1 × 10$^{-6}$ | 0.6 | 0.2 | 0.4 | 0.4 | 0.6 |
| | 1.0 × 10$^{-5}$ | 0.8 | 0.3 | 0.3 | 0.3 | 0.9 |
| | 4.0 × 10$^{-5}$ | 0.7 | 0.3 | 0.3 | 0.3 | 0.9 |

TABLE 20-continued

| Crack Defect Ratio (%) in Epitaxial Layer Growth [C Concentration: $2.0 \times 10^{16}$ cm$^{-3}$] [Diameter: 6 inches] | Average Dislocation Density (cm$^{-2}$) | | | | |
|---|---|---|---|---|---|
| [Second Notch Region] | 1200 | 3300 | 5600 | 18000 | 50000 |
| $9.0 \times 10^{-5}$ | 0.8 | 0.2 | 0.4 | 0.3 | 0.8 |
| $3.0 \times 10^{-4}$ | 1.2 | 0.8 | 0.6 | 0.9 | 1.5 |

As shown in Experimental Examples 9 and 10, it can be seen that the crack defect ratio in manufacturing of the substrate and in growth of the epitaxial layer on the substrate is low in the GaAs crystal substrate having a diameter not smaller than 150 mm and not greater than 205 mm and a thickness not smaller than 300 μm and not greater than 800 μm and including any of the flat portion and the notch portion in a part of the outer edge thereof when a concentration of Si atoms is not lower than $3.0 \times 10^{16}$ cm$^{-3}$ and not higher than $3.0 \times 10^{19}$ cm$^{-3}$ and when the average dislocation density is not lower than 0 cm$^{-2}$ and not higher than 15000 cm$^{-2}$ or the average residual strain is not less than $2 \times 10^{-6}$ and not more than $1 \times 10^{-4}$ in any of the second flat region and the second notch region and when a concentration of C atoms is not lower than $1.0 \times 10^{15}$ cm$^{-3}$ and not higher than $5.0 \times 10^{17}$ cm$^{-3}$ and when the average dislocation density is not lower than 3000 cm$^{-2}$ and not higher than 20000 cm$^{-2}$ or the average residual strain is not less than $2 \times 10^{-6}$ and not more than $1 \times 10^{-4}$ in any of the second flat region and the second notch region.

Furthermore, it can be seen that the crack defect ratio in manufacturing of the substrate and in growth of the epitaxial layer on the substrate is lower in the GaAs crystal substrate above when a concentration of Si atoms is not lower than $3.0 \times 10^{16}$ cm$^{-3}$ and not higher than $3.0 \times 10^{19}$ cm$^{-3}$ and when the average dislocation density is not lower than 0 cm$^{-2}$ and not higher than 15000 cm$^{-2}$ and the average residual strain is not less than $2 \times 10^{-6}$ and not more than $1 \times 10^{-4}$ in any of the second flat region and the second notch region and when a concentration of C atoms is not lower than $1.0 \times 10^{15}$ cm$^{-3}$ and not higher than $5.0 \times 10^{17}$ cm$^{-3}$ and when the average dislocation density is not lower than 3000 cm$^{-2}$ and not higher than 20000 cm$^{-2}$ and the average residual strain is not less than $2 \times 10^{-6}$ and not more than $1 \times 10^{-4}$ in any of the second flat region and the second notch region.

It should be understood that the embodiments and Examples disclosed herein are illustrative and non-restrictive in every respect. The scope of the present invention is defined by the terms of the claims rather than the embodiments and Examples above and is intended to include any modifications within the scope and meaning equivalent to the terms of the claims.

REFERENCE SIGNS LIST

9 GaAs source material; 10 GaAs crystalline body; 10*f* intended flat portion; 10*n* intended notch portion; 10*s* GaAs seed crystal; 11 GaAs crystal substrate; 11*f* flat portion; 11*fr*, 11*frc* first flat region, second flat region; 11*n* notch portion; 11*nr*, 11*nrc* first notch region, second notch region; 100 crystal growth apparatus; 101 crucible; 102 crucible base; 103 heater; 104 heat-insulating material; 105 pressure vessel; 201 grindstone; 202*u* cooling water container; 202*w* cooling water; LR length; WR width; PL polarized light

The invention claimed is:

1. A gallium arsenide crystal substrate including a main surface having a diameter not smaller than 150 mm and not greater than 205 mm and a thickness not smaller than 300 μm and not greater than 800 μm,
   a part of an outer edge of the gallium arsenide crystal substrate including any of a flat portion and a notch portion,
   the gallium arsenide crystal substrate containing any of silicon atoms at a concentration not lower than $3.0 \times 10^{16}$ cm$^{-3}$ and not higher than $3.0 \times 10^{19}$ cm$^{-3}$ and carbon atoms at a concentration not lower than $1.0 \times 10^{15}$ cm$^{-3}$ and not higher than $5.0 \times 10^{17}$ cm$^{-3}$,
   in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface,
   when the gallium arsenide crystal substrate contains the silicon atoms, the gallium arsenide crystal substrate having an average dislocation density not lower than 0 cm$^{-2}$ and not higher than 15000 cm$^{-2}$,
   when the gallium arsenide crystal substrate contains the carbon atoms, the gallium arsenide crystal substrate having an average dislocation density not lower than 3000 cm$^{-2}$ and not higher than 20000 cm$^{-2}$,
   the gallium arsenide crystal substrate having average residual strain not less than $2 \times 10^{-6}$ and not more than $1 \times 10^{-4}$ in any of the first flat region and the first notch region.

2. The gallium arsenide crystal substrate according to claim 1, containing the silicon atoms at the concentration not lower than $3.0 \times 10^{16}$ cm$^{-3}$ and not higher than $3.0 \times 10^{19}$ cm$^{-3}$, having the average dislocation density not lower than 0 cm$^{-2}$ and not higher than 15000 cm$^{-2}$ in any of the first flat region and the first notch region, and having the average residual strain not less than $2 \times 10^{-6}$ and not more than $1 \times 10^{-4}$ in any of the first flat region and the first notch region.

3. The gallium arsenide crystal substrate according to claim 2, having a carrier concentration not lower than $1.0 \times 10^{16}$ cm$^{-3}$ and not higher than $1.0 \times 10^{19}$ cm$^{-3}$.

4. The gallium arsenide crystal substrate according to claim 3, having the thickness not smaller than 650 μm and not greater than 800 μm.

5. The gallium arsenide crystal substrate according to claim 4, wherein
   the main surface has the diameter not smaller than 203.2 mm and not greater than 205 mm, and
   the thickness is not smaller than 750 μm and not greater than 800 μm.

6. The gallium arsenide crystal substrate according to claim 1, containing the carbon atoms at the concentration not lower than $1.0\times10^{15}$ cm$^{-3}$ and not higher than $5.0\times10^{17}$ cm$^{-3}$, having the average dislocation density not lower than 3000 cm$^{-2}$ and not higher than 20000 cm$^{-2}$ in any of the first flat region and the first notch region, and having the average residual strain not less than $2\times10^{-6}$ and not more than $1\times10^{-4}$ in any of the first flat region and the first notch region.

7. The gallium arsenide crystal substrate according to claim 6, having resistivity not lower than $1.0\times10^{7}$ Ω·cm and not higher than $5.0\times10^{8}$ Ω·cm.

8. The gallium arsenide crystal substrate according to claim 7, having the average residual strain not less than $7.0\times10^{-5}$ and not more than $1\times10^{-4}$ in any of the first flat region and the first notch region.

9. The gallium arsenide crystal substrate according to claim 8, having the thickness not smaller than 650 μm and not greater than 800 μm.

10. A gallium arsenide crystal substrate including a main surface having a diameter not smaller than 150 mm and not greater than 205 mm and a thickness not smaller than 650 μm and not greater than 800 μm,
  a part of an outer edge of the gallium arsenide crystal substrate including any of a flat portion and a notch portion,
  the gallium arsenide crystal substrate containing silicon atoms at a concentration not lower than $3.0\times10^{16}$ cm$^{-3}$ and not higher than $3.0\times10^{19}$ cm$^{-3}$
  in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface,
  the gallium arsenide crystal substrate having an average dislocation density not lower than 0 cm$^{-2}$ and not higher than 15000 cm$^{-2}$,
  the gallium arsenide crystal substrate having average residual strain not less than $2\times10^{-6}$ and not more than $1\times10^{-4}$ in any of the first flat region and the first notch region,
  the gallium arsenide crystal substrate having a carrier concentration not lower than $1.0\times10^{16}$ cm$^{-3}$ and not higher than $1.0\times10^{19}$ cm$^{-3}$.

11. A gallium arsenide crystal substrate including a main surface having a diameter not smaller than 150 mm and not greater than 205 mm and a thickness not smaller than 650 μm and not greater than 800 μm,
  a part of an outer edge of the gallium arsenide crystal substrate including any of a flat portion and a notch portion,
  the gallium arsenide crystal substrate containing carbon atoms at a concentration not lower than $1.0\times10^{15}$ cm$^{-3}$ and not higher than $5.0\times10^{17}$ cm$^{-3}$,
  in any of a first flat region extending over a width from the flat portion to a position at a distance of 2 mm in a direction perpendicular to a straight line indicating the flat portion in the main surface and a first notch region extending over a width from the notch portion to a position at a distance of 2 mm in a direction perpendicular to a curve indicating the notch portion in the main surface,
  the gallium arsenide crystal substrate having an average dislocation density not lower than 3000 cm$^{-2}$ and not higher than 20000 cm$^{-2}$,
  the gallium arsenide crystal substrate having average residual strain not less than $7.0\times10^{-5}$ and not more than $1\times10^{-4}$ in any of the first flat region and the first notch region
  the gallium arsenide crystal substrate having resistivity not lower than $1.0\times10^{7}$ Ω·cm and not higher than $5.0\times10^{8}$ Ω·cm.

\* \* \* \* \*